(12) United States Patent
Kamath

(10) Patent No.: US 7,612,976 B2
(45) Date of Patent: Nov. 3, 2009

(54) TRANSIENT VOLTAGE PROTECTION CIRCUIT BOARDS AND MANUFACTURING METHODS

(75) Inventor: Hundi Panduranga Kamath, Los Altos, CA (US)

(73) Assignee: Cooper Technologies Company, Houston, TX (US)

( * ) Notice: Subject to any disclaimer, the term of this patent is extended or adjusted under 35 U.S.C. 154(b) by 338 days.

(21) Appl. No.: 11/498,916

(22) Filed: Aug. 3, 2006

(65) Prior Publication Data

US 2007/0019354 A1   Jan. 25, 2007

Related U.S. Application Data

(63) Continuation-in-part of application No. 11/186,514, filed on Jul. 21, 2005, now Pat. No. 7,567,416.

(51) Int. Cl.
*H02H 1/00* (2006.01)

(52) U.S. Cl. ..................................................... 361/127

(58) Field of Classification Search .................. 361/127
See application file for complete search history.

(56) References Cited

U.S. PATENT DOCUMENTS

| 5,262,754 | A | | 11/1993 | Collins ........................ 338/21 |
| 5,483,407 | A | | 1/1996 | Anastasio et al. ............. 361/56 |
| 5,486,264 | A | * | 1/1996 | Ghandour .................... 438/746 |
| 2004/0000725 | A1 | | 1/2004 | Lee ............................. 257/778 |

FOREIGN PATENT DOCUMENTS

WO     WO 97/21230 A1     6/1997

OTHER PUBLICATIONS 3M. (Mar. 2000). Visual Inspection Guide for 3M 7303 Z-Axis Film [Brochure].*
3M, Z-Axis Adhesive Film (ZAF), 7303, Apr. 1999.*

* cited by examiner

*Primary Examiner*—Robert DeBeradinis
*Assistant Examiner*—Scott Bauer
(74) *Attorney, Agent, or Firm*—Armstrong Teasdale LLP

(57) ABSTRACT

Circuit boards including embedded transient voltage protection.

33 Claims, 13 Drawing Sheets

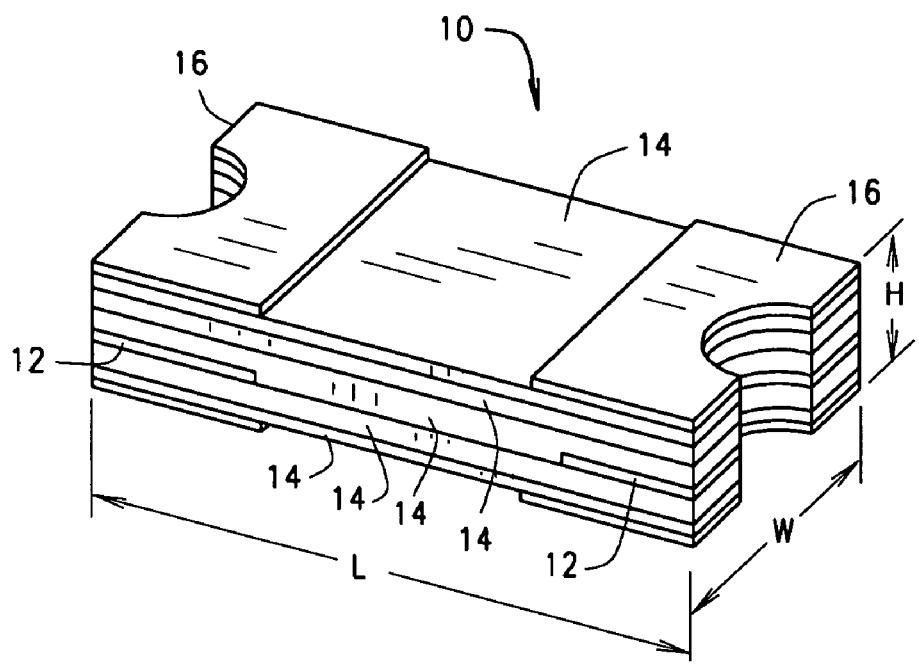
F I G . 1
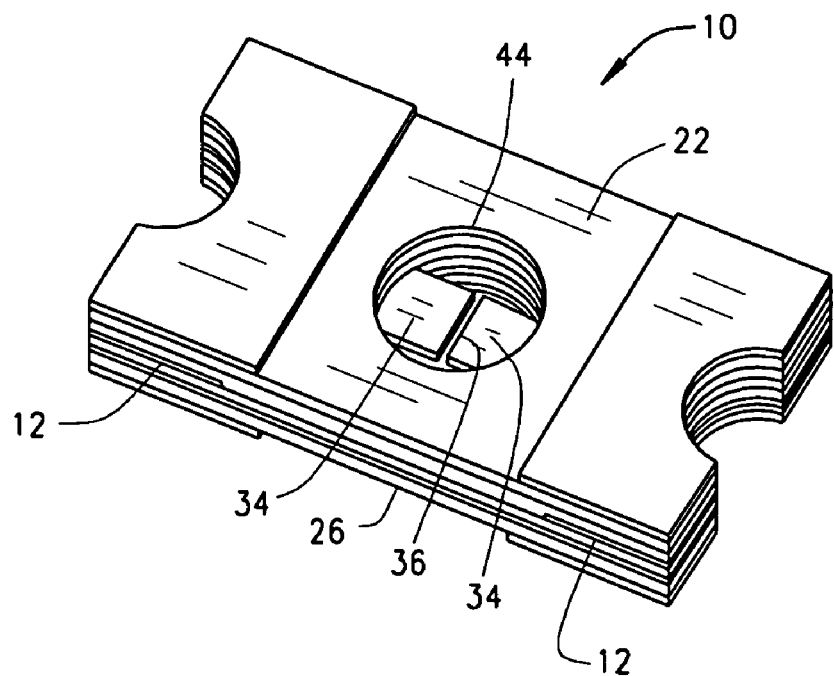
F I G . 4

TRANSIENT VOLTAGE PROTECTION CIRCUIT BOARDS AND MANUFACTURING METHODS

CROSS REFERENCE TO RELATED APPLICATIONS

This application is a continuation-in-part application of U.S. application Ser. No. 11/186,514 filed Jul. 21, 2005 now U.S. Pat. No. 7,567,416 and entitled Transient Voltage Protection Device, Material, and Manufacturing Methods, the complete disclosure of which is hereby incorporated by reference in its entirety.

BACKGROUND OF THE INVENTION

This invention relates generally to overvoltage protection devices for protecting electronic equipment and to methods of making such devices, and more specifically to devices that are commonly referred to as "surge protection" or "transient voltage suppression" devices.

Transient voltage suppression devices have been developed in response to the need to protect the ever-expanding number of electronic devices upon which today's technological society depends from high voltages of a short, or transient duration. Electrical transient voltages can be created by, for example, electrostatic discharge or transients propagated by human contact. Examples of electrical equipment which typically employ transient voltage protection equipment include telecommunications systems, computer systems and control systems.

BRIEF DESCRIPTION OF THE DRAWINGS

FIG. 1 is a perspective view of a transient voltage suppression device according to the present invention.

FIG. 4 is a perspective view of the device shown in FIG. 1 at a first stage of manufacture.

DETAILED DESCRIPTION OF THE INVENTION

Figure 2:
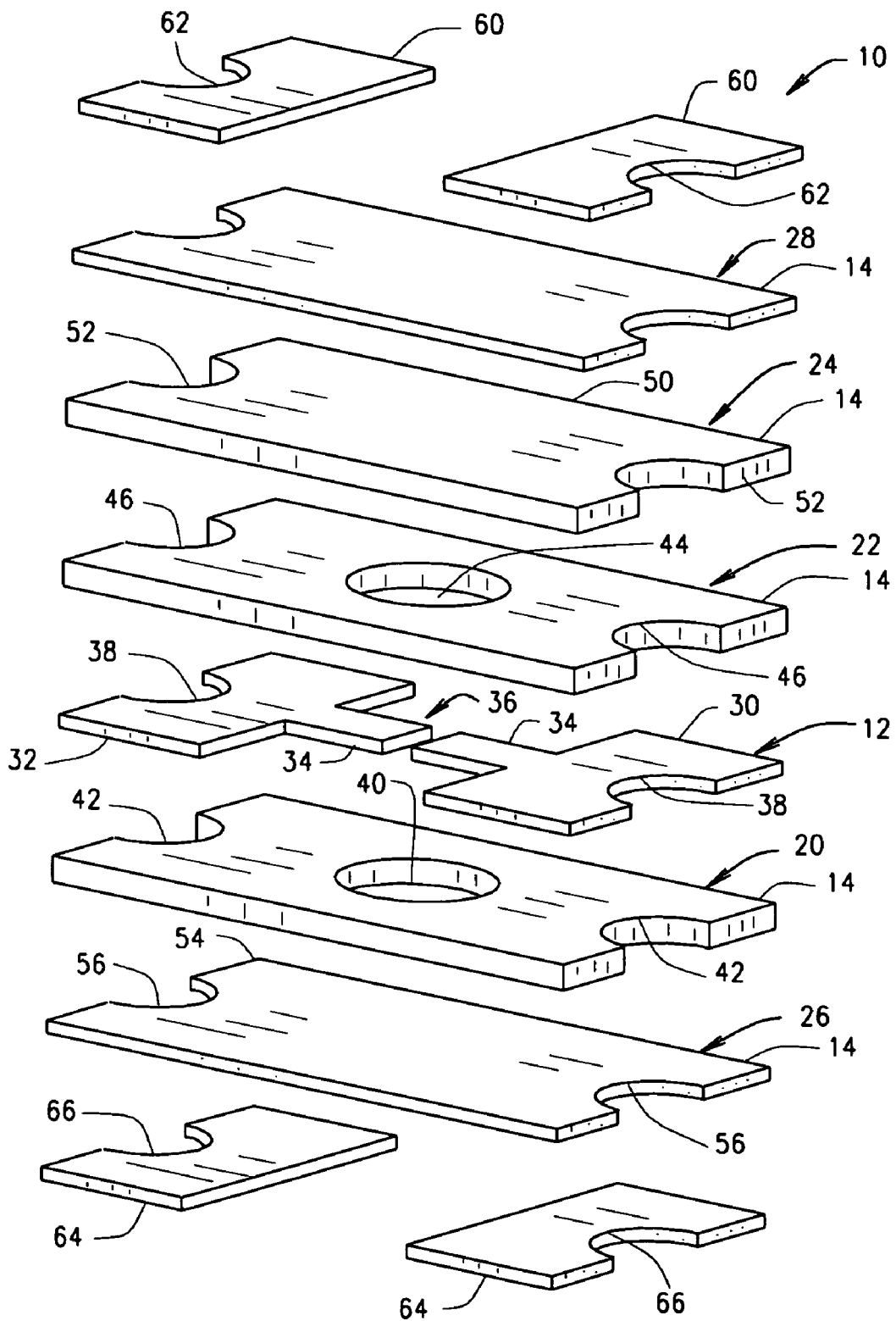
FIG. 2 is an exploded perspective view of the device shown in FIG. 1.

Transient voltage suppression devices are of increasing interest for protecting electronic components and assemblies from high voltages of a short, or transient duration due to, for example, electrostatic discharge or transients propagated by human contact.

For a full appreciation of the inventive aspects of exemplary embodiments of the invention described below, the disclosure herein will be segmented into sections. Existing transient voltage suppression devices are discussed in Part I. Discrete surface mount transient voltage suppression components according to exemplary embodiments of the invention and methods of manufacturing the same are disclosed in Part II. Exemplary embodiments of circuit board constructions having integrated transient voltage suppression capability and methods of manufacturing the same are disclosed in Part III.

I. Introduction to Transient Voltage Suppression Devices

Some known transient voltage suppression devices include a material having a variable impedance that interconnects, for example, a signal conductor pad and a ground conductor pad formed upon a ceramic substrate or printed circuit board substrate materials. Variable impedance materials, also sometimes referred to as "overstress responsive compositions" are sometimes fabricated as a mixture of conductive and/or semi-conductive particles suspended as a matrix within a binding material such as an insulative resin. The signal and ground pads are separated by a small gap on the surface of the substrate, and the variable impedance material is placed into the gap to interconnect the ground and signal conductors. Through-holes or vias extend through the substrate on either end of the device and are plated to provide an electrical path to the signal and ground pads on the substrate. In a surface mount device, one of the plated vias may be connected to a signal conductor or trace of a circuit board, and the other of the plated vias may be connected to a ground conductor trace of a circuit board. The signal and ground pads of the device are therefore connected to signal and ground conductors, respectively, of an electrical system to be protected.

The variable impedance material exhibits a relatively high resistance (sometimes referred to herein as the "off-state") when the voltage and/or current passing through the signal conductor is within a specified range, and a relatively low impedance (referred to herein as the "on-state") when the voltage and/or current exceeds a predetermined threshold. In the on-state, the pulse or transient voltage experienced by the signal conductor will be shunted through the device to the ground conductor of the electrical system, and the voltage associated with the pulse will be clamped at a relatively low value for the duration of the pulse. The variable impedance material recovers after the voltage or current pulse has passed and returns to its high impedance state.

While such devices can be effective to protect electronic equipment from transient pulses, they are subject to a number of manufacturing difficulties. For example, the ground and signal pads are typically formed by etching and photolithographic techniques in which layers of conductive material are removed from the substrate, sometimes referred to as a subtractive formation process, to form the ground and signal pads. The gap between the ground and signal pads is typically cut or machined with a laser or other known technique at a separate stage of manufacture from the conductor formation, and controlling the gap formation is difficult and expensive.

Additionally, compounding the variable impedance material involves many processing stages and can also be difficult to consistently produce. Due to the small size of some devices, especially in chip type devices, the variable impedance material can be difficult to apply to the gap, and providing termination structure to connect the device to circuitry can be problematic. Cumulatively, these and other difficulties lead to higher production costs and decreased manufacturing yields of acceptable devices in the fabrication process.

It would be desirable to provide a lower cost and more reliable manufacture of such devices so that transient voltage suppression devices may be produced with increased production yields.

II. Discrete Transient Voltage Protection Devices

FIG. 1 is a perspective view of a transient voltage suppression device 10 in accordance with an exemplary embodiment of the present invention. For the reasons set forth below, the transient voltage suppression device 10 is believed to be manufacturable at a lower cost than conventional transient voltage suppression device while providing higher production yields of satisfactory products.

The transient voltage suppression device 10 may have a layered construction, described in detail below, and includes an electrode 12 defining a conductive path enclosed in a number of dielectric layers 14 as explained below. The electrode 12 includes a gap (not shown in FIG. 1) that interrupts the conductive path, and a variable impedance material, described below, is provided in the gap. The variable impedance material exhibits a relatively high impedance when subjected to voltage and/or current up to a predetermined threshold value, and exhibits a relatively low impedance when subjected to voltage and/or current that exceeds the predetermined threshold.

The electrode 12 electrically extends between and is in a conductive relationship with surface mount terminations 16. The terminations 16, in use, are coupled to conductors, terminals, contact pads, or circuit terminations of a printed circuit board (not shown). More specifically, one of the terminations 16 may be coupled to a signal conductor, and the other of the terminations 16 may be coupled to a ground conductor. When voltage and or/current current flowing through the signal conductor is below a predetermined threshold, the variable impedance material is in the high resistance state (sometimes referred to herein as the "off-state") in which substantially no current flows through the variable impedance material in the electrode gap. Consequently, in the off state, substantially no current is carried across the electrode between the terminations 16, during which time the signal conductor is ungrounded.

As the voltage and/or current flowing through the signal conductor approaches the predetermined threshold, dependant upon characteristics of the variable impedance material employed in the device 10, the variable impedance material switches to the low impedance state (referred to herein as the "on-state"). That is, the electrical characteristics of the variable impedance material will change such that most, if not all, of the current flows through the variable impedance material in the electrode gap, and the current flows between the terminations 16 to ground. As such, a pulse or transient voltage experienced by the signal conductor is be shunted to the ground conductor, and the voltage associated with the pulse may be clamped at a relatively low value for the duration of the pulse. The variable impedance material recovers after the voltage or current pulse has passed and returns to its high impedance state. Thus, the signal conductor and associated circuitry can continue normal operation shortly after the pulse has ended. In this way, the circuitry associated with the signal conductor is protected without substantial interruption to the affected circuitry. Transient voltage and surge protection for circuitry connected to the device is therefore provided.

In an illustrative embodiment, the transient voltage suppression device 10 may have a chip configuration. That is, the device 10 may be generally rectangular in shape and includes a width W, a length L and a height H suitable for surface mounting of the device 10 to a printed circuit board while occupying a small space. For example, L may be approximately 0.040 to 0.060 inches and W may be approximately 0.020 to 0.030 inches, such that the transient voltage suppression device occupies roughly the same area on a circuit board as other electrical chip components, including but not limited to chip fuses, chip resistors, and the like as those in the art may appreciate. H is approximately equal to the combined thickness of the various layers 12 and 14 employed to fabricate the transient voltage suppression device 10. Notably, H is considerably less than either L or W to maintain a low profile of the transient voltage suppression device 10. It is recognized, however, that actual dimensions of the device 10 may vary from the illustrative dimensions set forth herein to greater or lesser dimensions, including dimensions of more than one inch without departing from the scope of the present invention.

FIG. 2 is an exploded perspective view of the transient voltage suppression device 10 illustrating the various layers 12, 14 employed in fabrication of the transient voltage suppression device 10. Specifically, in an exemplary embodiment, the transient voltage suppression device 10 may be constructed essentially from six layers including the electrode 12 sandwiched between a first and second dielectric layers 20, 22 which, in turn, are sandwiched between third and fourth dielectric layers 24, 26. A fifth dielectric layer 28 overlies the third dielectric layer 24. As will be appreciated below, the dielectric layers 20, 22, 24, 26 and 28 each serve a distinct purpose in the device 10, and the materials used to fabricate the layers accordingly vary from one another.

Unlike known transient voltage suppression devices, the electrode 12 is an electroformed, 3-20 micron thick nickel foil which is fabricated and formed independently from the first and second dielectric layers 20 and 22. Specifically, in an illustrative embodiment, the electrode 12 is fabricated according to a known additive process, such as electro-forming process wherein the desired shape of the electrode layer is plated up, and a negative image is cast on a photo-resist coated substrate (not shown). A thin layer of metal, such as nickel, is subsequently plated onto the negative image cast, and the plated layer is then peeled from the cast to be a free standing foil extending between the first and second dielectric layers 20 and 22. While nickel is believed to be advantageous for its structural strength when peeled from the cast, it is contemplated that other metals and conductive compositions and alloys may likewise be used to form the electrode in another embodiment of the invention.

As shown in FIG. 2, the electrode 12 is formed in the shape of a capital I with wider anchor portions 30 and 32 and a relatively narrow path portion 34 extending between the anchor portions 30 and 32, thereby defining a conductive path between the first and second dielectric layers 20 and 22. A small gap 36, on the order of several microns in an exemplary embodiment, interrupts the conductive path through the path portions 34, and the variable impedance material (not shown in FIG. 2) is applied to the gap 36 in the manner explained below to interconnect the path portions 34 of the electrode 12. Also, termination openings 38 are formed into the ends of the anchor portions 30, 32 to provide electrical connection of the electrode 12 to a circuit board as explained below. The wider anchor portions accommodate manufacturing tolerances in formation of the openings 38.

Notably, the electrode gap 36 is integrally formed into the image cast so that the electroformed electrode is plated with the gap 36 already present or pre-formed. That is, a separate manufacturing step to form the gap 36 is avoided, and so are related costs and difficulties of doing so, by forming the gap simultaneously with the electrode 12 in the electroforming process. The gap 36 may be formed centrally in the electrode 12 as shown in FIG. 2, or may be formed elsewhere within the electrode 12 if desired. While one particular shape of the electrode 12 is illustrated in FIG. 2, it is understood that various other shapes of the shapes of the electrode 12 may likewise be employed in other embodiments.

Separate and independent formation of the electrode 12 allows for other advantages as well in comparison to known constructions of transient voltage suppression devices. For example, separate and independent formation of the electrode 12 permits greater accuracy in the control and position of the electrode layer with respect to the dielectric layers 20, 22, 24, 26 and 28 when the transient voltage suppression device 10 is constructed. In comparison to etching processes of known such devices, independent formation of the electrode 12 permits greater control over the shape of the conductive path relative to the first and second dielectric layers 20, 22. While etching tends to produce oblique or sloped side edges of the conductive path once formed, substantially perpendicular side edges are possible with electroforming processes, therefore providing a more repeatable performance in the trigger voltage, clamping voltage, and leakage current characteristics of the manufactured device 10. Additionally, separate and independent formation of the electrode provides for electrodes having varying thickness in a vertical dimension (i.e., perpendicular to the dielectric layers) to produce vertical profiles or contours in the electrode 12 that can vary performance characteristics. Still further, multiple metals or metal alloys may be used in the separate and independent formation process, also to vary performance characteristics of the device.

While electroforming of the electrode 12 in a manner separate and distinct from the first and second dielectric layers 20, 22 is believed to be advantageous, it is understood that the electrode 12 may be alternatively formed by other methods while still obtaining some of the advantages of the present invention. For example, the electrode 12 may be an electro deposited metal foil applied to the first dielectric layer 20 according to known techniques, including other additive techniques such as screen printing and deposition techniques, and subtractive techniques such as chemical etching and the like as known in the art.

The first dielectric layer 20 underlies the electrode 12 and includes a circular shaped opening 40 underlying a portion of the path portions 34, and in particular, the gap 36, of the electrode 12. Termination openings 42 are formed into either end of the first dielectric layer 20. Likewise, the second dielectric layer 22 overlies the electrode 12 and includes a circular shaped opening 44 overlying a portion of the path portions 34, and in particular, the gap 36, of the electrode 12. Termination openings 46 are formed into either end of the second dielectric layer 22.

Notably, and in an exemplary embodiment, the path portions 34 of the electrode 12 contact a surface of neither of the first and second dielectric layers 20, 22 in the vicinity of the gap 36. The openings 40, 44 in the respective first and second dielectric layers 20, 22 expose the gap 36 in the electrode and define a receptacle above and below the electrode gap 36 for the introduction of the variable impedance material. That is, the openings 40, 44 provide a confined location for the variable impedance material in the device 10, and it may be accordingly be ensured that the variable impedance material substantially surrounds and fills the gap 36 to ensure proper operation of the device 10.

While circular shaped openings 40, 44 are illustrated in the first and second dielectric layers 20, 22, it is recognized that other shapes may be used to form the openings in another embodiment as desired.

In an illustrative embodiment, the first and second dielectric layers 20, 22 are each fabricated from a commercially available, 50 micron thick polyimide dielectric film including a 4 micron adhesive film to secure the layers to one another and to the electrode 12. It is appreciated, however, that in alternative embodiments, other dimensions of materials may be utilized, and further it is contemplated that suitable electrical dielectric and insulation materials (polyimide and non-polyimide), may be employed. It is also recognized that adhesiveless materials may be employed in the first and second dielectric layers 20 and 22.

The third dielectric layer 24 overlies the second dielectric layer 22 and includes a continuous surface 50 extends between termination openings 52 at opposing ends of the third dielectric layer 24. Likewise, the fourth dielectric layer 26 underlies the first dielectric layer 20 and includes a continuous surface 54 extending between termination openings 56 at opposing ends of the fourth dielectric layer 26. The continuous surfaces 50, 54 of the respective third and fourth dielectric layers 24, 26 closes the openings 40, 44 in the first and second dielectric layers 20, 22 and seals the variable impedance material and the gap 36 of the electrode.

In an illustrative embodiment, the third and fourth dielectric layers 24, 26 are each fabricated from a polyimide dielectric film. In one exemplary embodiment, the third dielectric layer 24 may be a 50 micron thick polyimide dielectric film including a 4 micron adhesive film to secure the layers to one another, and the fourth dielectric film may be a 25 micron thick polyimide dielectric film including an 18 micron copper laminate. It is appreciated, however, that in alternative embodiments, other dimensions of materials may be employed, and it is recognized that other suitable electrical dielectric and insulation materials (polyimide and non-polyimide), may be employed. It is further contemplated that adhesiveless materials may be employed in the third and fourth dielectric layers 24 and 26.

The fifth dielectric layer 28 overlies the third dielectric layer 24, and in an exemplary embodiment may be a 25 micron thick polyimide dielectric film including an 18 micron copper laminate. The includes surface mount pads 60 formed on one surface thereof in a known manner. The termination pads 60 include termination openings 62. The fourth dielectric layer 26 also includes surface mount pads 64, and each of the pads 64 includes termination openings 66. In an exemplary embodiment the fourth and fifth dielectric layers 26, 28 are copper clad polyimide laminates, and the copper is etched away from the layers to form the surface mount pads 60, 62. It is understood, however, that the pads 60, 62 could be alternatively formed in another known manner using, for example, electroforming, printing, or deposition techniques.

Figure 5:
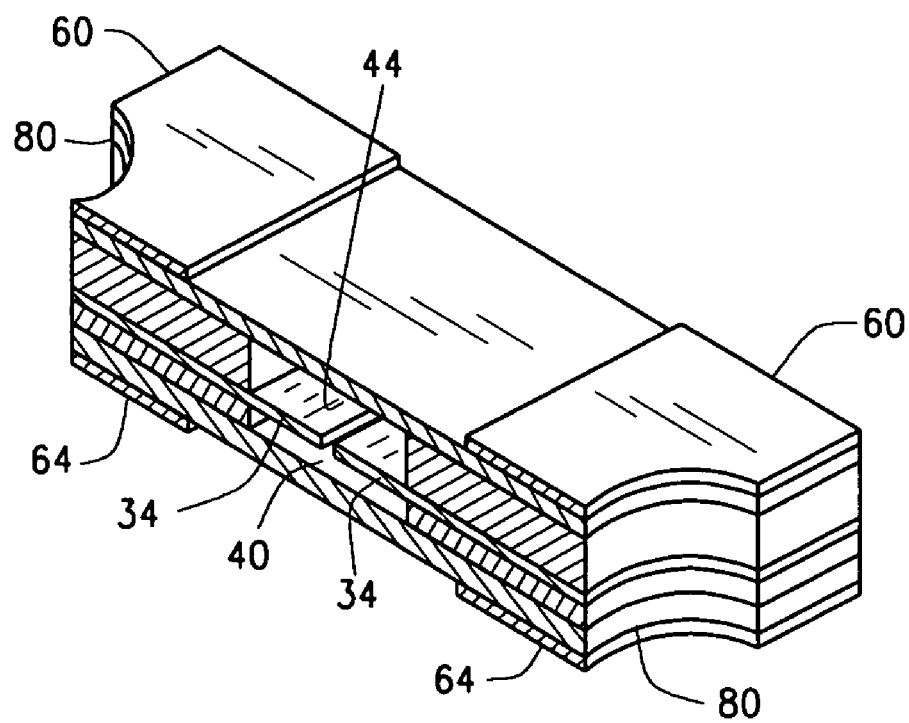
FIG. 5 is a partial sectional view of the device shown in FIG. 1 at another stage of manufacture.

When the layers 12, 20, 22, 24, 26, and 28 are stacked, the termination openings of the layers are aligned with one another and the inner surfaces of the termination openings are metallized with a conductive material, such as copper, on a vertical face 80 (FIG. 5) thereof to complete a conductive path between the surface mount pads 60, 64 and minor surfaces of the anchor portions 30, 32 of the electrode 12. In other words, the metallized face 80 extends substantially perpendicular to the major planar surfaces of the electrode 12, and is tangential to the vertical end faces (the minor surfaces) of the anchor portions 30, 32. Castellated contact terminations are therefore provided on the ends of the device 10.

It is also recognized that at least some of the benefits of the present invention may be achieved by employing other termination structure than in lieu of castellated contacts for connecting the transient voltage suppression device 10 to an electrical circuit. Thus, for example, contact leads (i.e. wire terminations), wrap-around terminations, dipped metallization terminations, and the like may be employed as needs dictate or as desired.

For purposes of describing an exemplary manufacturing process employed to fabricate the transient voltage suppression device 10, the dielectric layers of the transient voltage suppression device 10 are referred to according to the following table:

| Process Layer | FIG. 2 Layer | FIG. 2 Reference |
| --- | --- | --- |
| 1 | First Dielectric Layer | 20 |
| 2 | Second Dielectric Layer | 22 |
| 3 | Third Dielectric Layer | 24 |
| 4 | Fourth Dielectric Layer | 26 |
| 5 | Fifth Dielectric Layer | 28 |

Figure 3:
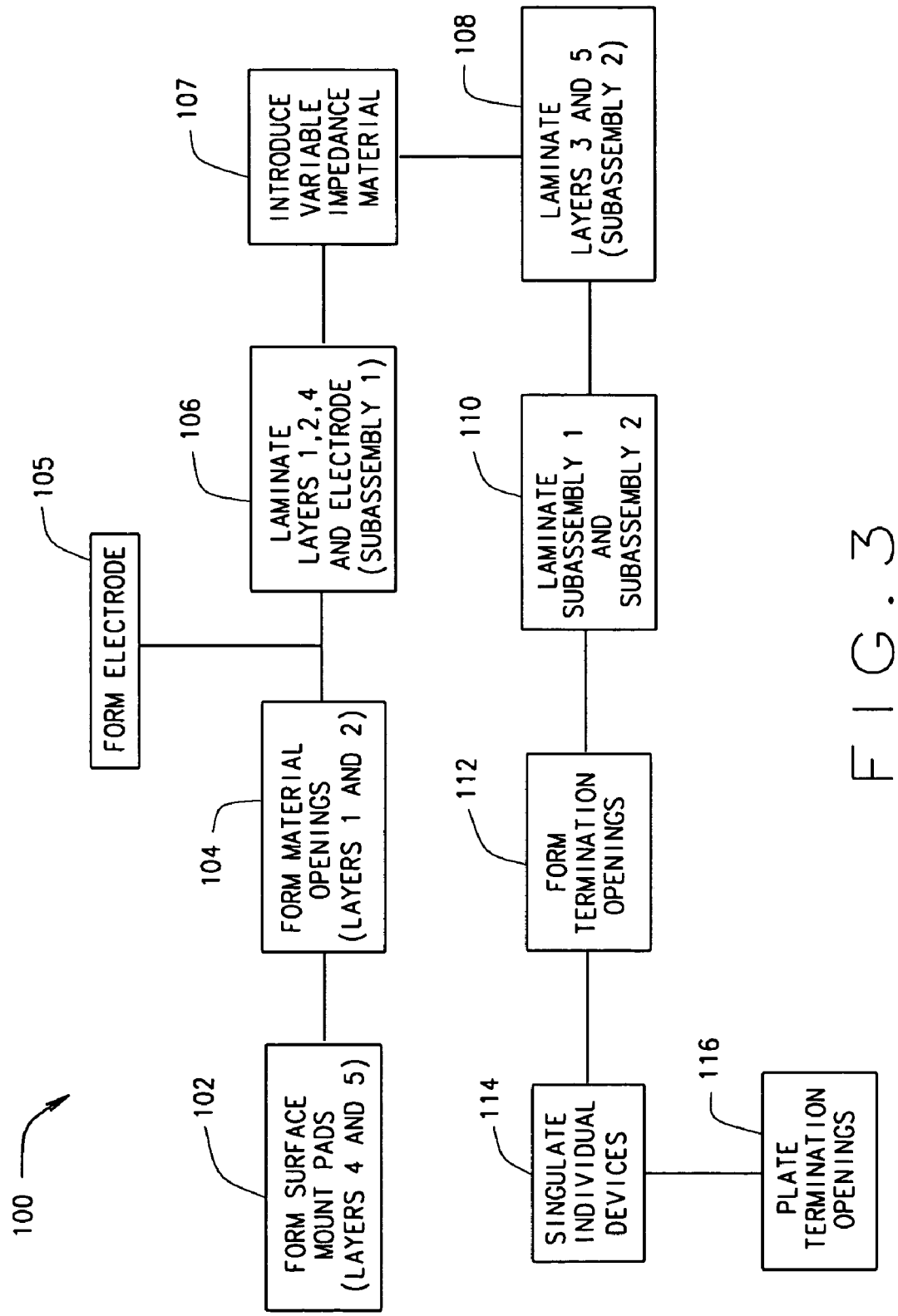
FIG. 3 is a process flow chart of a method of manufacturing the device shown in FIGS. 1 and 2.

Using these designations, FIG. 3 is a flow chart of an exemplary method 100 of manufacturing the transient voltage suppression device 10 (shown in FIGS. 1 and 2).

The surface mount pads are formed 102 on layers 4 and 5 according to any of the techniques described above or known in the art, and the openings in layers 1 and 2 are formed 104 prior to assembly of the device as explained below. Electrodes 12 are formed 105 independently from dielectric layers, such as with the aforementioned electroforming process.

Figure 5A:
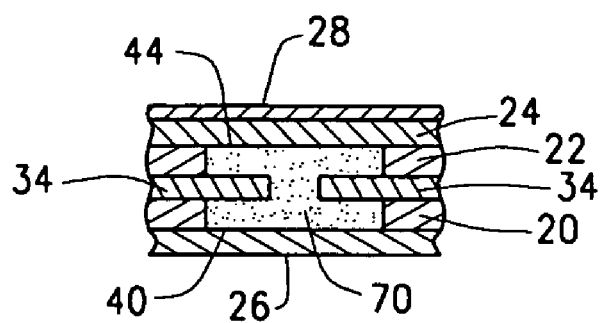
FIG. 5*a* is an elevational view of a portion of FIG. 5.

Layers 1, 2, and 4 are laminated 106 to one another with the electrode 12 extending between layers 1 and 2, and with layer 4 closing the opening 40 in layer 4. Thus, as shown in FIG. 4, a subassembly is formed wherein the electrode path portions 34 and the electrode gap 36 are exposed and accessible within the opening 44 of layer 2, while layer 4 closes the opening 40 in layer 1 proximate the electrode gap 36. The variable impedance material 70 (FIG. 5*a*) is then introduced 107 to the opening 44 and fills each of the opening 44 in layer 2 and the opening 40 in layer 1, so that the electrode path portions 34 and the electrode gap 36 are substantially surrounded by the variable impedance material 70 both above and below the electrode path portions 34 and the gap 36, and while substantially filling the gap 36 with the variable impedance material 70.

Layers 3 and 5 are laminated 108 to one another to form a second subassembly for the device 10, and then the second subassembly is laminated to the first subassembly from step 106. When the first and second subassemblies are laminated to one another, the second subassembly closes the opening 44 in layer 2.

Figure 6:
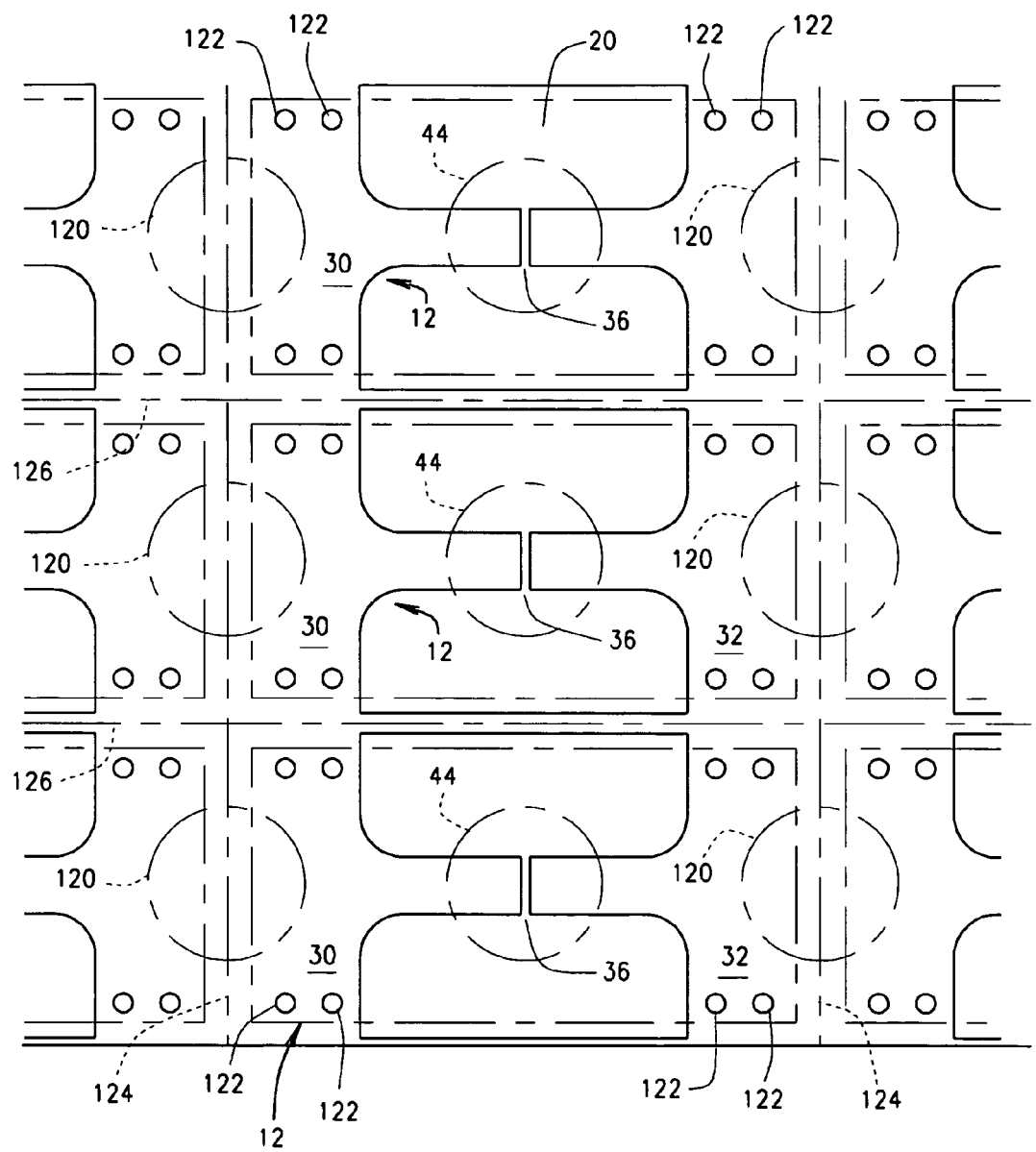
FIG. 6 is a top plan view of a portion of the device shown in FIG. 1 at a bulk stage of manufacture.

The termination openings are then formed 112 through the laminated first and second subassemblies according to, for example, a known drilling process While transient voltage suppression devices 10 could be manufactured singly according to the method thus far described, in an illustrative embodiment, transient voltage suppression devices 10 are fabricated collectively in sheet form and then separated or singulated 114 into individual devices 10, as shown schematically in FIG. 6 wherein a plurality of electrodes 12 including gaps 36 are formed on a larger panel of material, and with the openings 44 and the termination openings 120 outlined in phantom. Additionally, as can be seen in FIG. 6, the anchor portions 30, 32 of the electrodes include anchoring holes 122 that serve to position and maintain the electrodes 12 relative to and in between layer 1 and layer 2. A cutting tool may be moved along intersecting dicing lines 124, 126 to singulate the devices 10.

The devices 10 may be formed in a batch process, or with a continuous roll to roll lamination process to manufacture a large number of transient voltage protection devices with minimal time.

The termination openings are plated or otherwise metallized 116 on a vertical face 80 thereof (FIG. 5), either before or after the singulation 114 of the devices, to complete the terminations 16 shown in FIG. 1.

It is contemplated that greater or fewer layers may be fabricated and assembled into the device 10 without departing from the basic methodology described above. Using the above described methodology, transient voltage suppression devices may be efficiently formed using low cost, widely available materials in a batch process using relatively inexpensive known techniques and processes. Additionally, the methodology provides greater process control in fewer manufacturing steps than conventional transient voltage suppression device constructions. As such, higher manufacturing yields may be obtained at a lower cost.

Figure 7:
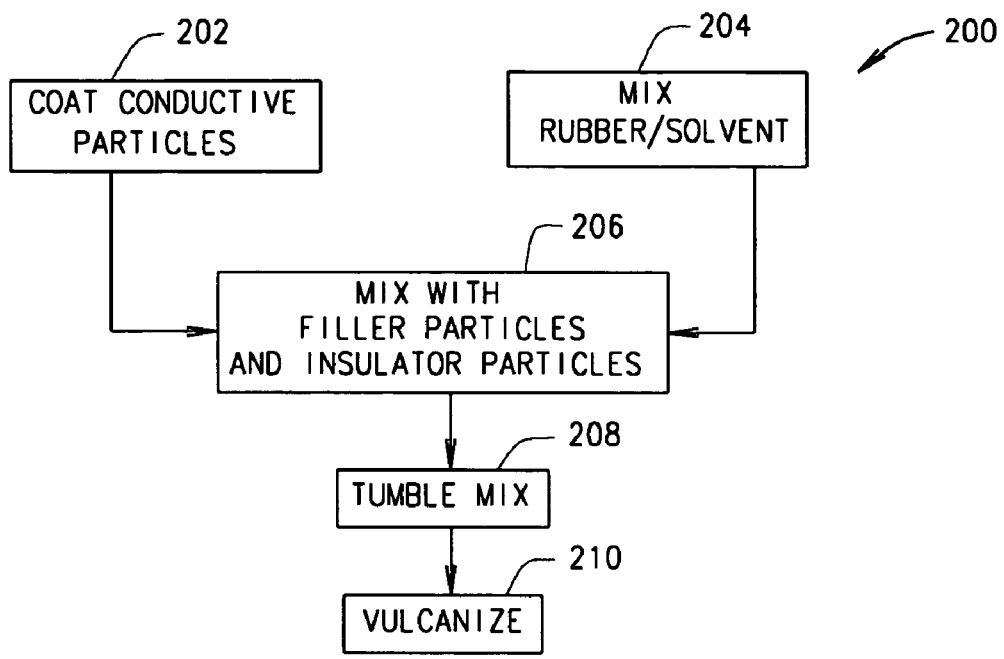
FIG. 7 is a process flowchart for the manufacture of a variable impedance material for the device shown in FIGS. 1-6.

In an exemplary embodiment, the variable impedance material 70 may be formulated from the following exemplary ingredients: conductive particles such as aluminum particles, a solvent such as Methyl n-Amyl Ketone (MnAK), a binder of polymer material such as flourosilicone rubber, insulator particles such as aluminum oxide, and filler particles including an arc quenching material such as barium sulfate and insulator spacer particles such as spherical borosilicate powders. The ingredients are processed as follows according to the method 200 illustrated in FIG. 7 to formulate the variable impedance material.

The conductive particles may be pre-coated 202 with an insulating material such as fumed silica, and the solvent and flourosilicone rubber are preferably premixed 204 in, for example, a planetary mixer for about 24 hours to provide solvated rubber. The solvated rubber is then mixed 206 with the pre-coated conductive particles and the filler material including the arc quenching particles and the insulator spacer particles, and the insulator particles in a mixer such as an overhead or bead mill for about 0.5 hours. Optionally, the mixture may be tumbled 208, for example, for about 24 hours after mixing. Then, the material may be vulcanized 210 and preserved for use in manufacturing the transient surge suppression devices 10.

Preferably, the variable impedance material 70 includes no more than 5% by weight of organic material, and thus for practical purposes is substantially free of organic material. Also, the volume percent ratio of conductive particles to rubber is preferably between about 0.5 to about 2, and more specifically between about 0.75 to about 1.5.

The choice of binder polymer and/or amount of filler in the variable impedance material 70, or the degree of crosslinking or vulcanization of the material can be varied to change tensile properties of the material and affect the thermal stress induced in the material when the material is heated as a result of a voltage pulse during operation of the device 10. By strategically selecting the binder polymer and/or amount of filler in the material, the degree of crosslinking or vulcanization of the material, the stress in the material in an overvoltage condition may be controlled to produce desired switching properties of the material between the on and off states. In general, the more stress that the device is subjected to, which is related to the binder polymer and amount of filler in the material formulation, the voltage at which the material changes from the off state to the on state is lowered. Thus, devices 10 having different sensitivities to overvoltage pulses may be provided.

For greater endurance to high voltage transient pulses, an anti-tracking material, such as iron oxide mixed with a polymer such as silicone, can be added to the filler in the material formulation. By varying the amount of anti-tracking material in the formulation, insulating properties and anti-tracking properties of the device 10 during an overvoltage condition may accordingly be varied.

The above-described formulation and method is believed to provide consistent variable impedance material for the device 10 at a lower cost, with less difficulty, and with a reduced processing time in relation to known formulations of variable impedance materials. Such formulation, as previously mentioned, produces a material exhibiting a relatively high impedance when subjected to voltage and/or current up to a predetermined threshold value, and exhibiting a relatively low impedance when subjected to voltage and/or current that exceeds the predetermined threshold. By way of example only, when used with the device 10 in the manner described above, the device 10 has a trigger voltage of about 100 to 300 V that causes the material to change from the high resistance state to the low impedance state, produces a clamped voltage during a transient voltage pulse event of about 20 to about 40 V, exhibits a leakage current of less than about 1 nA in normal operating conditions, and the material may withstand about 1000 transient voltages or pulse events.

While an exemplary variable impedance material has been described that may be utilized in the device 10, it is understood that other known variable impedance materials may be employed that are fabricated according to other known methods, while still achieving at least some of the advantages of the present invention. Likewise, while an exemplary transient voltage suppression device has been described that utilizes the variable impedance material produced according to the method 210, it is recognized that the variable impedance material could be used in other types of transient voltage protection devices. The foregoing description is therefore provided for illustrative purposes only and is not intended to limit the device 10 to use with any particular variable impedance material, or to limit the variable impedance material to use with any particular device.

Figure 8:
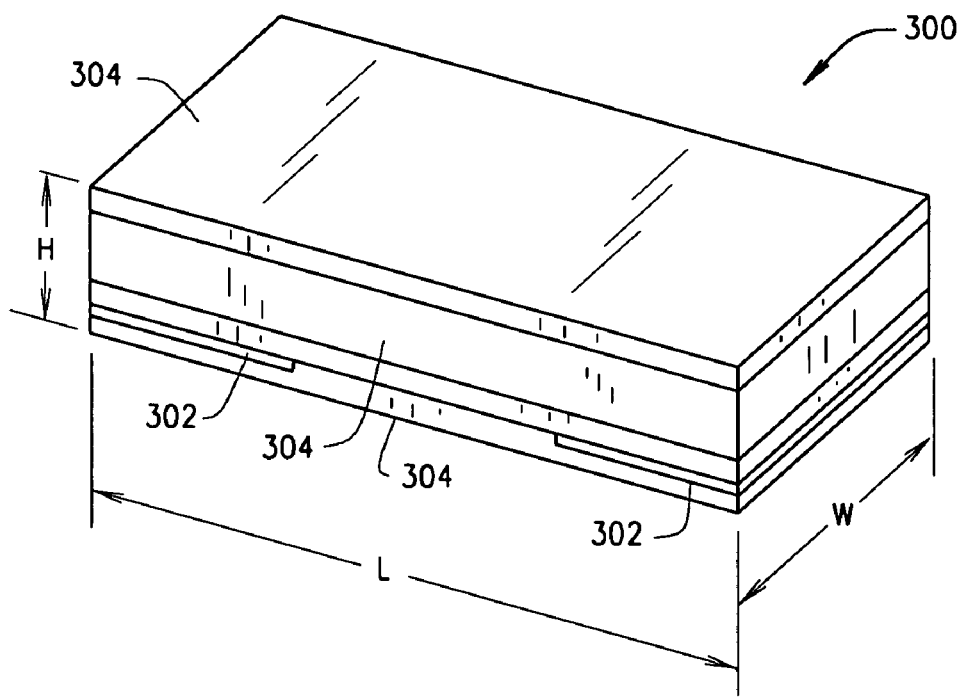
FIG. 8 is a perspective view of another embodiment of a transient voltage suppression device.

FIG. 8 is a perspective view of another embodiment of a transient voltage suppression device 300 in accordance with another exemplary embodiment of the present invention. The transient voltage suppression device 300 is also believed to be manufacturable at a lower cost than conventional transient voltage suppression device while providing higher production yields of satisfactory products.

The transient voltage suppression device 300 may have a layered construction, described in detail below, and includes an electrode 302 defining a conductive path enclosed in a number of dielectric layers 304 as explained below. The transient voltage suppression device 300 may have a chip configuration as illustrated in FIG. 8. That is, the device 300 may be generally rectangular in shape and includes a width W, a length L and a height H suitable for surface mounting of the device 300 to a printed circuit board while occupying a small space. For example, L may be approximately 0.040 to 0.060 inches and W may be approximately 0.020 to 0.030 inches, such that the transient voltage suppression device occupies roughly the same area on a circuit board as other electrical chip components, including but not limited to chip fuses, chip resistors, and the like as those in the art may appreciate. H is approximately equal to the combined thickness of the various layers 302 and 304 employed to fabricate the transient voltage suppression device 10. Notably, H is considerably less than either L or W to maintain a low profile of the transient voltage suppression device 300. It is recognized, however, that actual dimensions of the device 10 may vary from the illustrative dimensions set forth herein to greater or lesser dimensions, including dimensions of more than one inch without departing from the scope of the present invention.

Figure 9:
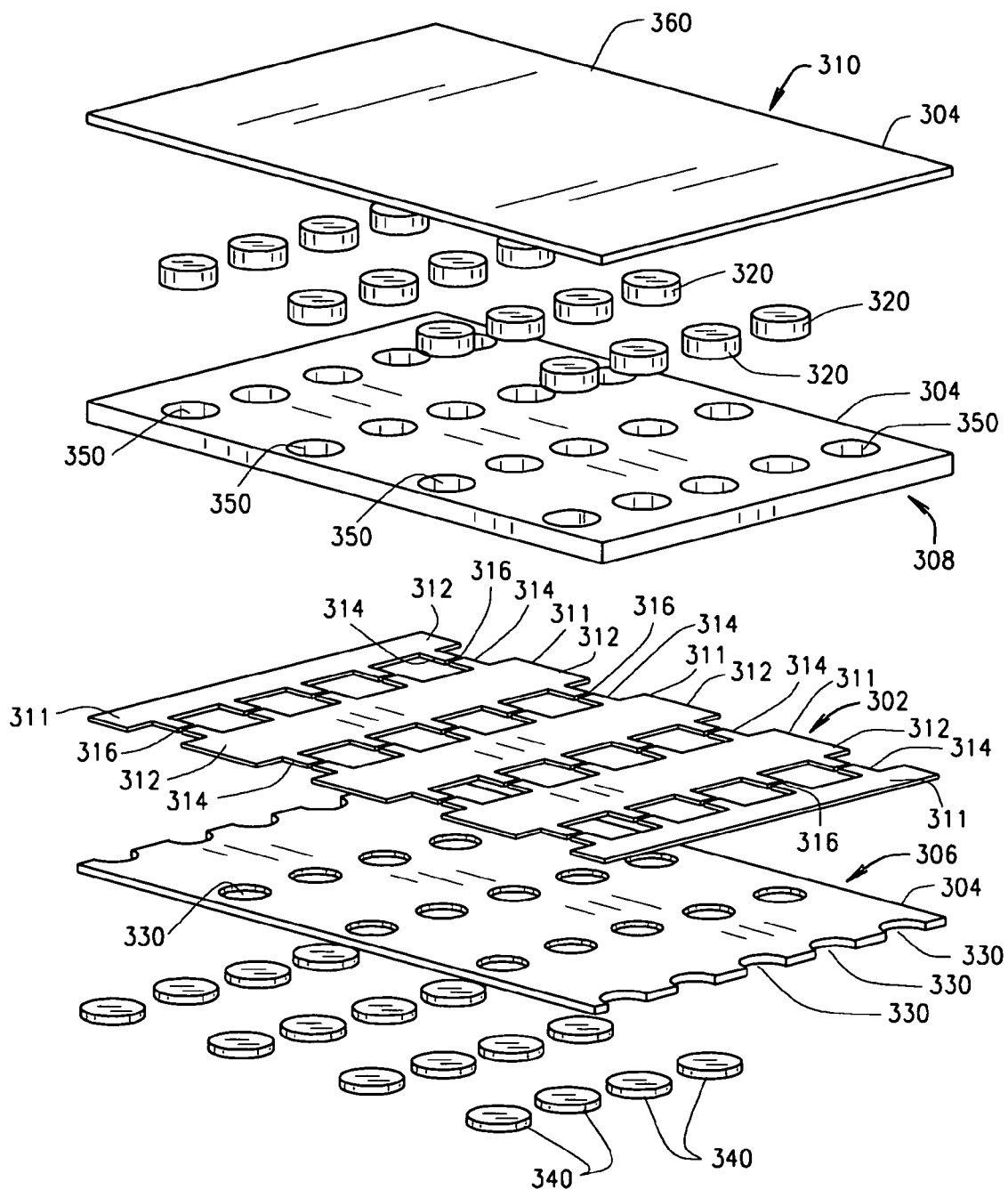
FIG. 9 is an exploded view of a bulk manufacture of the device shown in FIG. 8.

FIG. 9 is an exploded perspective view of transient voltage suppression device 300 in a bulk fabrication assembly. Specifically, in an exemplary embodiment, the transient voltage suppression device 300 is constructed essentially from four layers including an electrode 302 sandwiched between a first and second dielectric layers 306, 308 and a third dielectric layer 310 overlying the second dielectric layer 308.

The electrode layer 302 is an electroformed, 3-20 micron thick copper or nickel foil which is fabricated and formed independently from the first and second dielectric layers 306 and 308, the advantages of which are described above, although it is understood that the electrode layer 302 may be formed according to other known techniques in lieu of electroformation techniques if desired. Furthermore, other metals and conductive compositions and alloys may be used to form the electrode layer 302.

The electrode layer 302 is formed into multiple elements each having the shape of a capital I with wider anchor portions 311 and 312 and a relatively narrow path portion 314 extending between the anchor portions 311 and 312, thereby defining a conductive path between the first and second dielectric layers 306 and 308. A small gap 316, on the order of several microns in an exemplary embodiment, interrupts the conductive path through the path portions 314, and the variable impedance material 320 is applied to the gap 316 in the manner explained below to interconnect the path portions 314 of the electrode 302. The electrode gaps 316 are integrally formed into the image cast so that the electroformed electrode is plated with the gap 316 already present or pre-formed, thereby eliminating separate manufacturing steps to form the gaps 316, together with related costs and difficulties. The gaps 316 may be formed centrally in the electrode path portions 314 as shown in FIG. 9, or may be formed elsewhere within the electrode layer 302 if desired. While one particular shape of the electrode layer 302 is illustrated in FIG. 9, it is understood that various other shapes of the shapes of the electrode layer 302 may likewise be employed in other embodiments.

While electroforming of the electrode layer 302 in a manner separate and distinct from the first and second dielectric layers 306 and 308 is believed to be advantageous, it is understood that the electrode layer 302 may be alternatively formed by other methods while still obtaining some of the advantages of the present invention. For example, the electrode layer 302 may be an electro deposited metal foil applied to the first dielectric layer 306 according to known techniques, including other additive techniques such as screen printing and deposition techniques, and subtractive techniques such as chemical etching and the like as known in the art.

Figure 11:
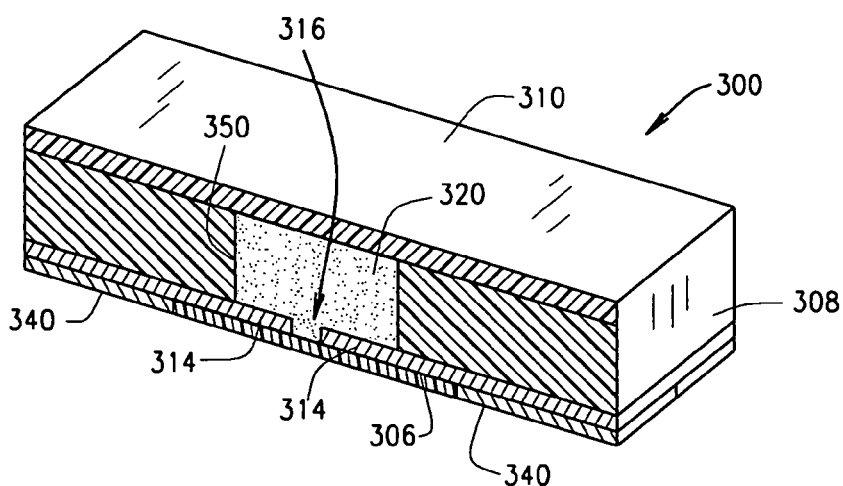
FIG. 11 is a sectional view of the device shown in FIG. 8.

The first dielectric layer 306 underlies the electrode layer 302 and includes circular shaped termination openings 330 underlying the anchor portions 311, 312 of the electrode layer 302, and more specifically, the termination openings 330 are spaced from the gaps 316 in the electrode layer 302. The termination openings 330 are filled with a conductive metal such as copper, for example, to provide surface mount pad terminations that directly engage and are in abutting contact with the major planar surfaces of the electrode anchor portions 311, 312, as best shown in FIG. 11.

It is recognized that at least some of the benefits of the present invention may be achieved by employing other termination structure in lieu of the surface mount pad terminations 340 for connecting the transient voltage suppression device 300 to an electrical circuit. Thus, for example, contact leads (i.e. wire terminations), wrap-around terminations, dipped metallization terminations, castellated contacts and the like may be employed as needs dictate or as desired.

Referring back to FIG. 9, the second dielectric layer 308 overlies the electrode layer 302 and includes circular shaped openings 350 overlying a portion of the electrode layer path portions 314, and in particular, the gaps 316, of the electrode layer 302. As such, the path portions 314 of the electrode layer 302 are exposed in the vicinity of the electrode gaps 316 within the openings 350. The openings 350 in the respective second dielectric layer 308 expose the gaps 316 in the electrode and defines receptacles above the gaps 316 for the introduction of the variable impedance material 320 (also shown in FIG. 11). That is, the openings 350 provide a confined location for the variable impedance material 320, and it may be accordingly be ensured that the variable impedance material substantially surrounds and fills the gaps 316 to ensure proper operation of the device 300. The third dielectric layer 310, however, is solid and has no openings in the vicinity of the electrode layer gaps 316.

In an illustrative embodiment, the first and second dielectric layers 306, 308 are each fabricated from a commercially available polyimide dielectric film including an adhesive to secure the layers to one another and to the electrode layer 302. As one example, the first dielectric layer 306 may be a commercially available 2 mil polyimide film, and the second dielectric layer 308 may be a commercially available 5 mil polyimide film.

It is appreciated, however, that in alternative embodiments, other suitable electrical dielectric and insulation materials (polyimide and non-polyimide), may be employed, and further that adhesiveless materials may be employed in the first and second dielectric layers 306 and 308.

The third dielectric layer 310 overlies the second dielectric layer 308 and includes a continuous surface 360 with no openings therein. The continuous surface 360 of the third dielectric layer 310 closes the openings 350 in the second dielectric layer 308 and seals the variable impedance material 320 and the electrode gasp 316.

In an illustrative embodiment, the third dielectric layer 310 is fabricated from a polyimide dielectric film. It is appreciated, however, that in alternative embodiments, other suitable electrical dielectric and insulation materials (polyimide and non-polyimide), may be employed, including an epoxy coating in lieu of a polyimide dielectric film.

Figure 10:
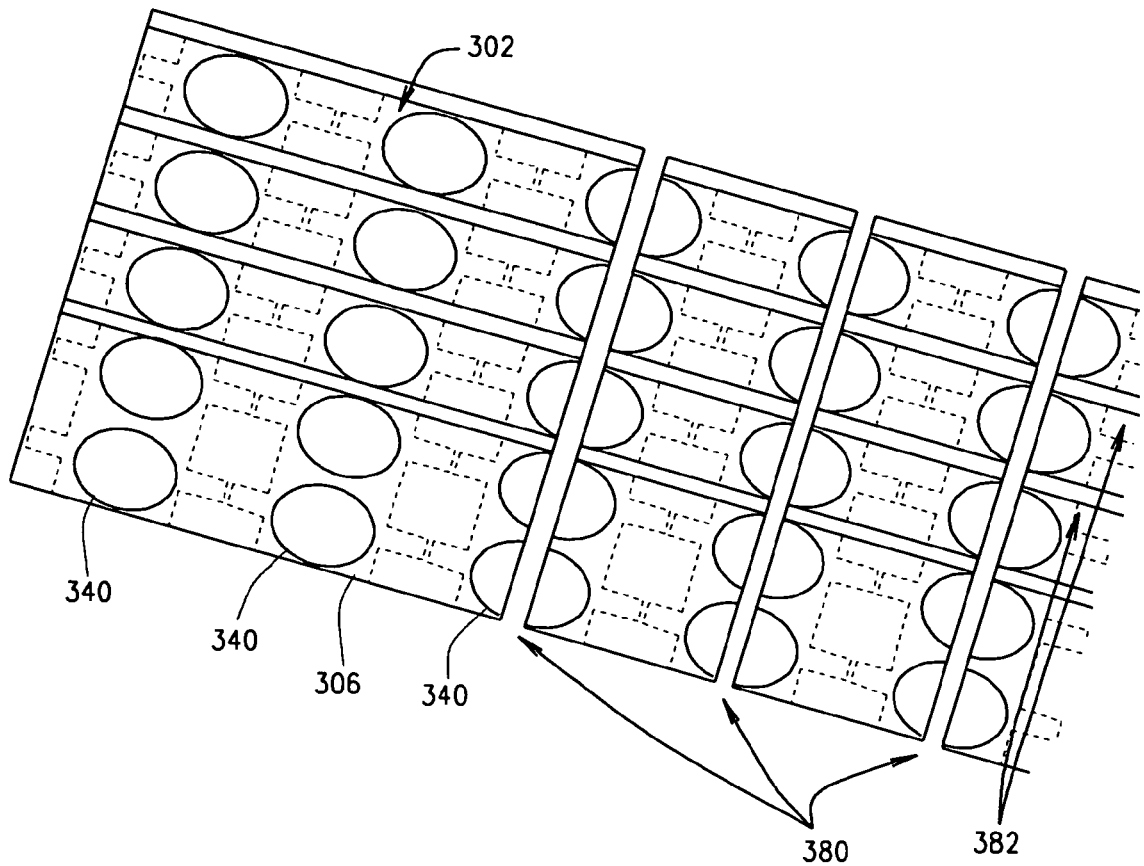
FIG. 10 is a bottom view of the bulk manufacture shown in FIG. 10 at one stage in the manufacturing process.

When the layers 302, 306, 308, and 310 are stacked and secured together with the variable impedance material 320 therein, the pads 340 are formed in the termination openings 330 of the first dielectric layer as shown in FIG. 10. FIG. 10 also schematically illustrates the electrode layer 302, and dicing lines 380 and 382 to singulate the assembled layers into discrete devices 300.

Once constructed, the device 300 operates substantially similar to the device 10 as described above.

For purposes of describing an exemplary manufacturing process employed to fabricate the transient voltage suppression device 300, the dielectric layers of the transient voltage suppression device 300 are referred to according to the following table:

| Process Layer | FIG. 2 Layer | FIG. 9 Reference |
| --- | --- | --- |
| 1 | First Dielectric Layer | 306 |
| 2 | Second Dielectric Layer | 308 |
| 3 | Third Dielectric Layer | 310 |

Figure 12:
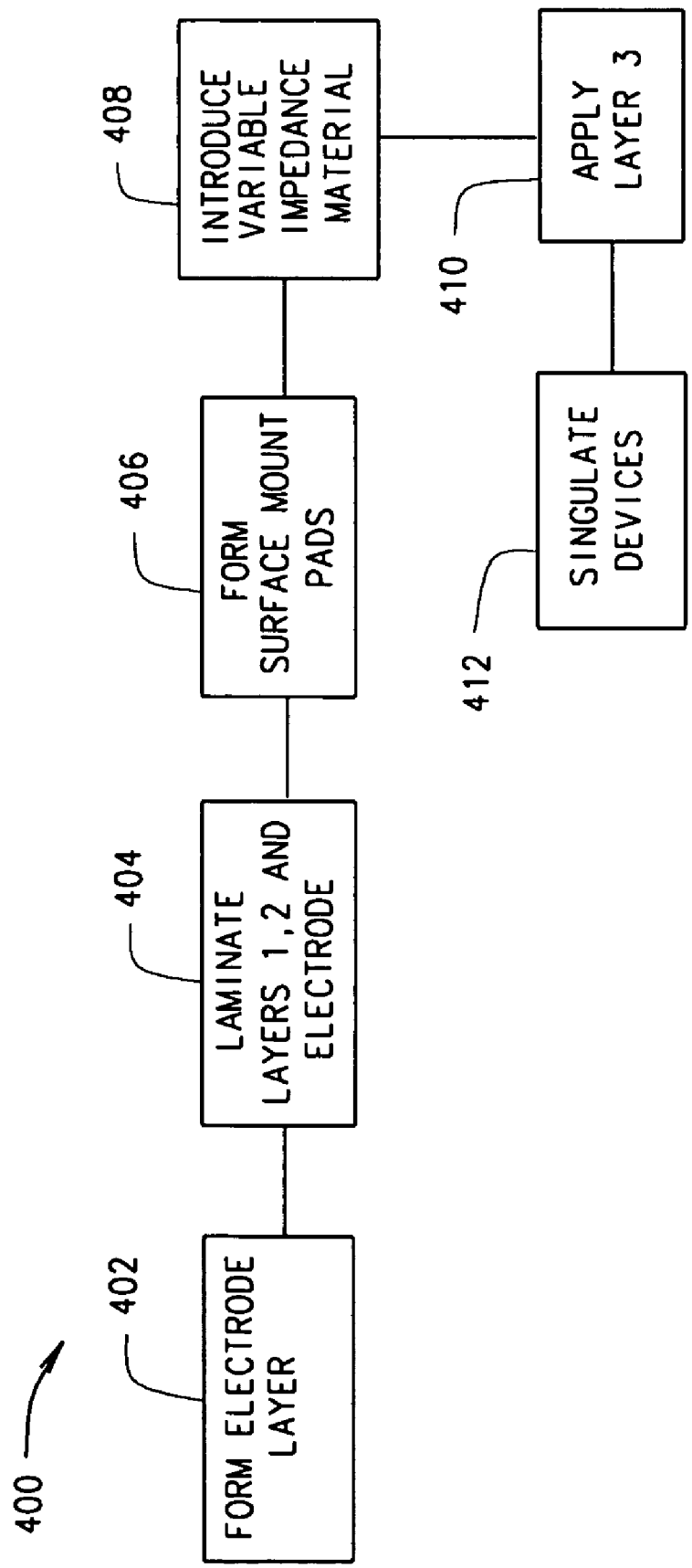
FIG. 12 is a process flow chart of a method of manufacturing the device shown in FIG. 8.

Using these designations, FIG. 12 is a flow chart of an exemplary method 400 of manufacturing the transient voltage suppression device 300.

The electrode layer is formed 402 independently from dielectric layers, such as with the aforementioned electroforming process, or another formation process known in the art, and layers 1 and 2 are laminated 404 to one another with the electrode layer extending between layers 1 and 2. Thus, a subassembly is formed wherein the electrode path portions 314 and the electrode gaps 316 are exposed and accessible within the openings 350 of layer 2, and the anchor portions 311, 312 of the electrode layer are exposed within the termination openings 330 of layer 1.

The surface mount pads are plated 406 within the openings in layer 1 in contact with the anchor portions 311, 312, and the variable impedance material 320 is introduced into the openings in layer 2 to substantially surround the electrode path portions 314 and fill the gaps 316. The variable impedance material may be the same or different from the variable impedance material 70 described above.

Layer 3 and is then applied 408 to the layer 2 in a known manner, such as a lamination process in the event that a polyimide material is used for layer 3, or by coating and curing in the case of an epoxy material being used for layer 3. Layer 3 closes the openings in layer 2 and seals the variable impedance material therein.

Finally, the individual components or devices 300 are separated or singulated 410 from one another along the dicing lines shown in FIG. 10. While transient voltage suppression devices 300 are described as being fabricated collectively in sheet form and then separated or singulated 410 into individual devices 300, the devices 300 could be individually fabricated if desired. The devices 300 may be formed in a batch process, or a continuous roll to roll lamination process to manufacture a large number of transient voltage protection devices with minimal time.

It is contemplated that greater or fewer layers may be fabricated and assembled into the device 300 without departing from the basic methodology described above. Especially when the openings 330 and 350 are pre-formed in layers 1 and 2, the method 400 may be completed in a relatively short period of time and with a reduced number of steps than the method 100 described above.

Using the above described methodology, transient voltage suppression devices may be efficiently formed using low cost, widely available materials in a batch process using relatively inexpensive known techniques and processes. Additionally, the methodology provides greater process control in fewer manufacturing steps than conventional transient voltage suppression device constructions. As such, higher manufacturing yields may be obtained at a lower cost.

Figure 13:
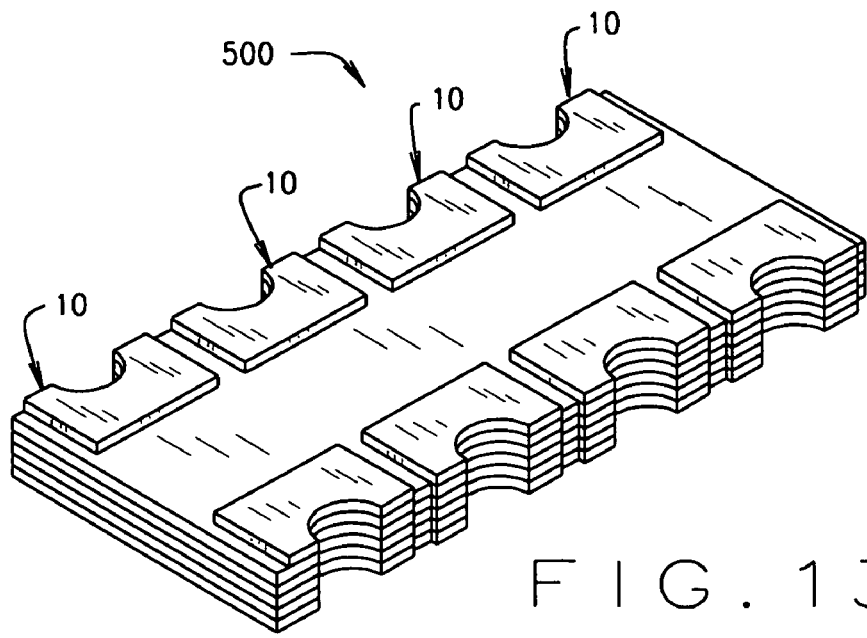
FIG. 13 is a perspective view of another embodiment of a transient voltage suppression device according to the present invention.
Figure 14:
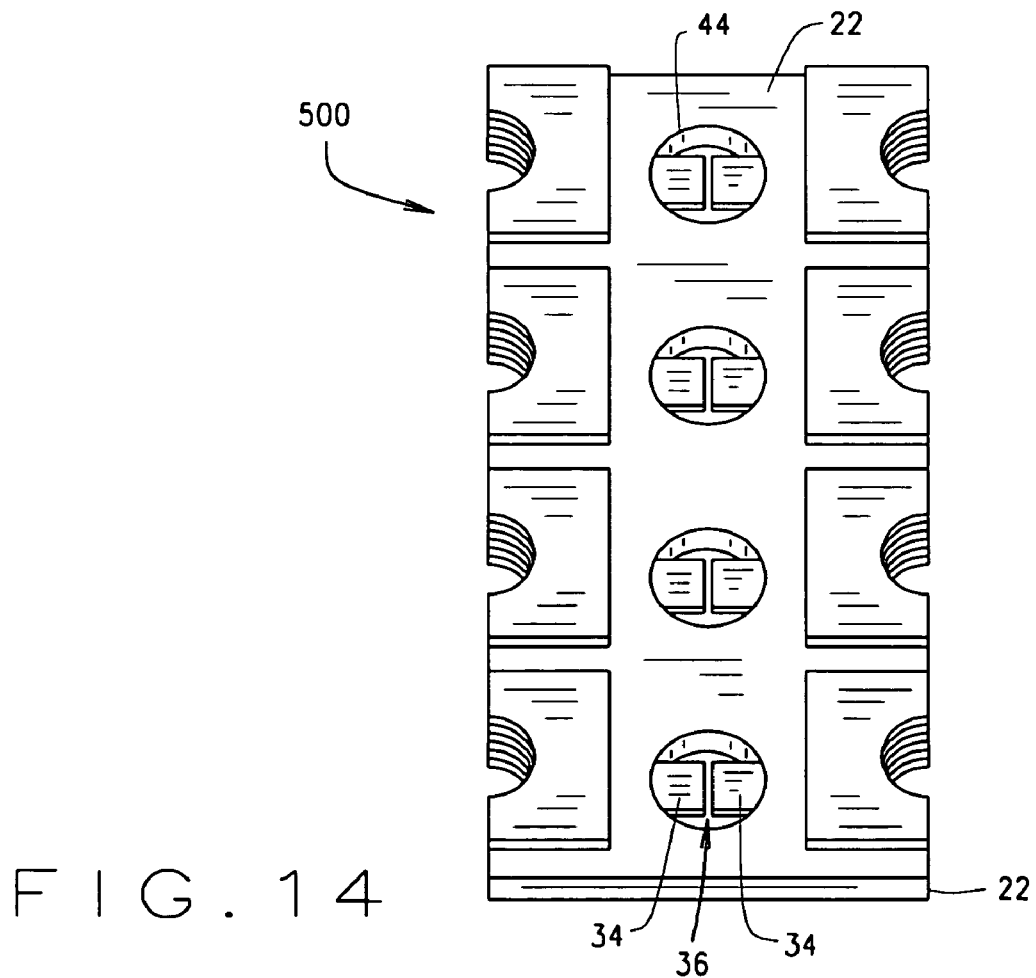
FIG. 14 is a top plan view of the device shown in FIG. 13 at one stage of manufacture.
Figure 15:
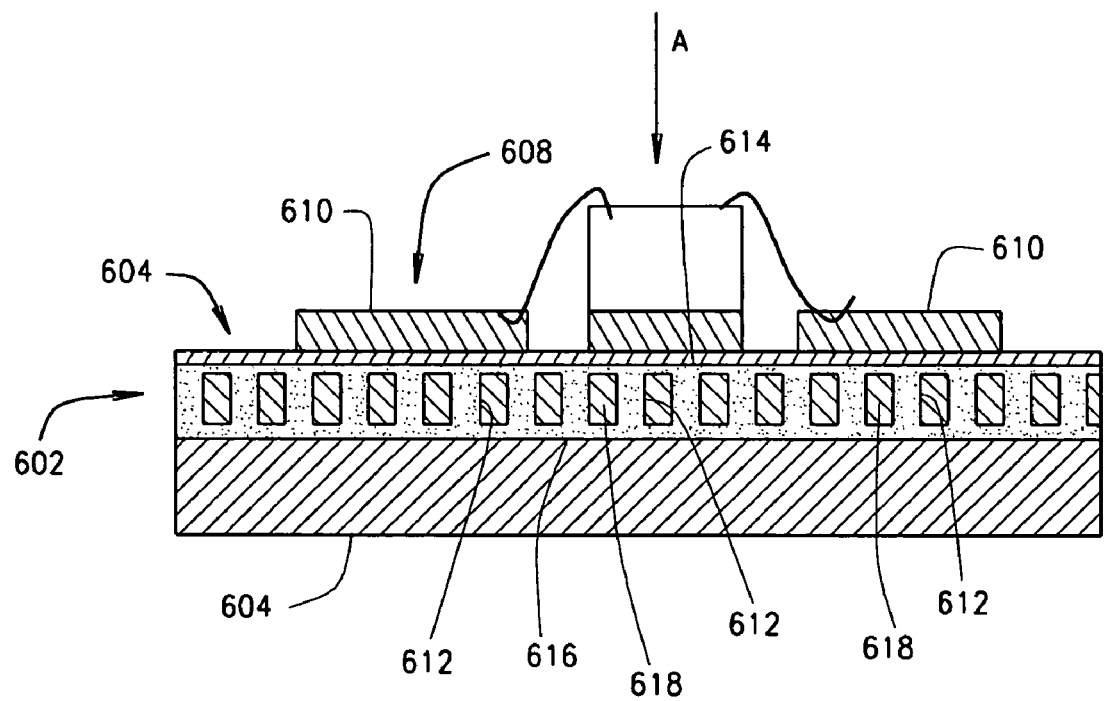
FIG. 15 is a schematic view of another embodiment of a transient voltage suppression circuit board.

FIGS. 13 and 14 illustrate another embodiment of a transient voltage suppression device 500 that is essentially a combination of four devices 10 described above in relation to FIGS. 1-6. Thus, in the illustrated embodiment, the device 500 provides four devices 10 in an in-line arrangement that may be connected to electronic circuitry in parallel to one another. While four devices 10 are integrated in the device 500 shown in FIG. 13, it is appreciated that more or less devices 10 may be provided in the device 500.

The device 500 may be constructed substantially as described above, with appropriate modifications of the dicing lines to form in-line devices 500 in lieu of discrete devices 10. As shown in FIG. 14, the electrode path portions 34 and the gaps 36 are exposed within the openings 44, 40 in the first and second dielectric layers 22, 20, respectively. Introduction of the variable impedance material 70 is therefore simplified, and for the reasons set forth above, the device 500 is manufacturable at a lower cost with higher production yields than known devices.

In-line combinations of devices 300, described above in relation to FIGS. 8-11, could likewise be provided according the methodology described above, with modification of the dicing lines to form in-line devices instead of single or discrete devices.

III. Circuit Boards with Surge Protection Arrays

While the embodiments described above in Part II are effective to provide transient voltage protection to electronic components associated with the discrete transient voltage protection devices, completely protecting a large number of components on circuit boards with discrete protection devices, such as those described above, can nonetheless be problematic. Providing and installing a large number of discrete devices to protect all components on the circuit board may introduce undesirable cost in the overall assembly. Additionally, and perhaps more importantly, a large number of discrete transient voltage protection devices used in combination on the same board occupies valuable space on the circuit board.

In light of increasing miniaturization of many electronic devices, such as cellular phones, for example, electronic components must occupy less space within the electronic device. Additionally, to accommodate increased functionality of modern electronic devices, more electronic components are typically required in the construction of circuit boards used in the device. That is, circuit board assemblies having a greater number of components must occupy a reduced amount of space within such electronic devices. Prolific numbers of discrete transient voltage protection devices and the space that they entail on a circuit board may present an obstacle to meeting space requirements and/or functionality requirements for increasingly miniaturized electronic devices.

One solution to this dilemma regarding board space and miniaturization issues is to reduce the number of discrete transient voltage protection devices by selectively connecting discrete transient voltage protection devices to some components deemed to be critical components but not to other components on the board. While critical components may be protected in such a manner, damage to the remaining components may still occur in a high transient voltage condition, resulting in impaired functionality and use of the electronic device. Such damage and impaired use of electronic devices is undesirable, and it would be desirable to provide a practical means of protecting more components on a circuit board, without compromising space requirements and device functionality.

FIGS. 15-18 illustrate embodiments of a transient voltage suppression device in the form of a circuit board 600 constructed according to the present invention that may provide transient voltage protection for a large number of electronic components with minimal impact on board space and miniaturization requirements for electronic devices, such as cellular phones or other hand held electronic devices, although the invention is not limited to such electronic devices. The device 600 may function as a circuit board having embedded transient voltage protection capability as explained below.

Referring to FIGS. 15-18, the device 600 has a stacked layer construction including a dielectric substrate layer 602, a ground plane 604 coupled to the substrate on one side thereof, a transmission layer 606 coupled to the dielectric substrate layer 602 opposite the ground plane 604, and a circuit layer 608 forming a circuit pattern on the transmission layer 606. The circuit layer 608 may include a number of conductive traces, lines and contact pads 610 that may be used to interconnect electronic components with surface mount techniques. The electronic components may include for example, a processor and peripheral components.

The substrate layer 602 is generally planar and is generally rectangular in the illustrated embodiment, although a variety of shapes of the substrate layer 602 may alternatively be utilized. In different embodiments, the substrate layer 602 may be fabricated from rigid circuit board materials, such as FR-4 board, phenolic, ceramic materials and the like. Alternatively, the substrate layer 602 may be fabricated from a flexible circuit material such as a polyimide material, a liquid crystal polymer, and the like. In an exemplary embodiment, the substrate layer 602 is a polyimide substrate having a thickness of less than 1 mil and is well suited to meet low profile height requirements for electronic devices and assemblies, although the thickness of the substrate layer 602 may be varied as desired in alternative embodiments. While polyimide is advantageous because it is available in thin films, other substrate materials, including but not limited to those mentioned above may likewise be utilized in other embodiments and for other applications wherein a low profile of the stacked device 600 is not a limiting constraint.

Figure 16:
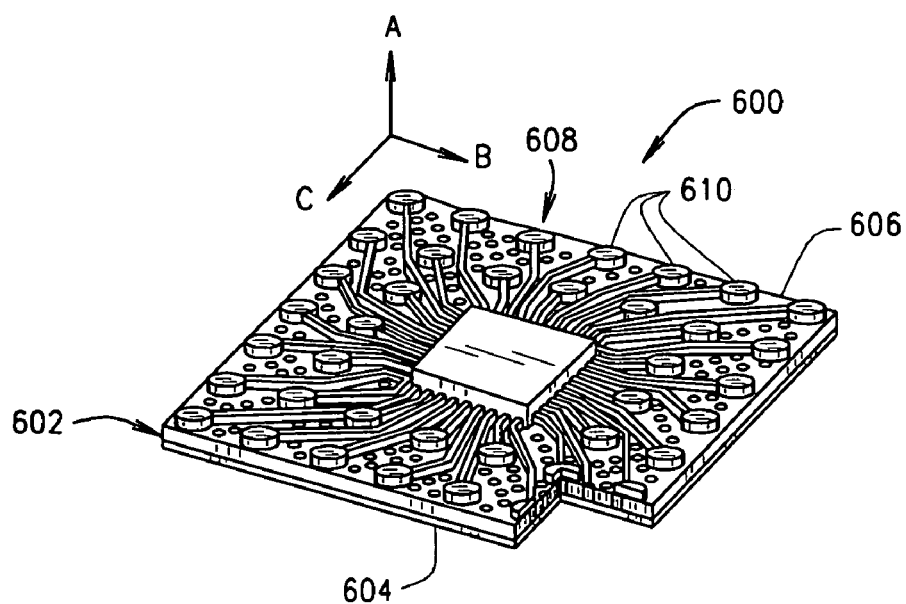
FIG. 16 is a perspective view of the circuit board shown in FIG. 15.
Figure 17:
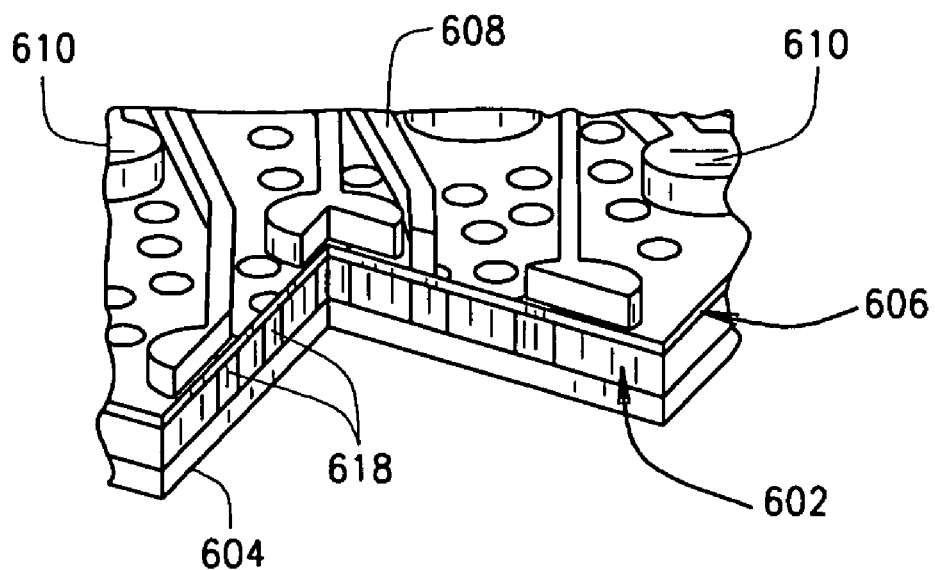
FIG. 17 is a magnified view of a portion of FIG. 16.
Figure 18:
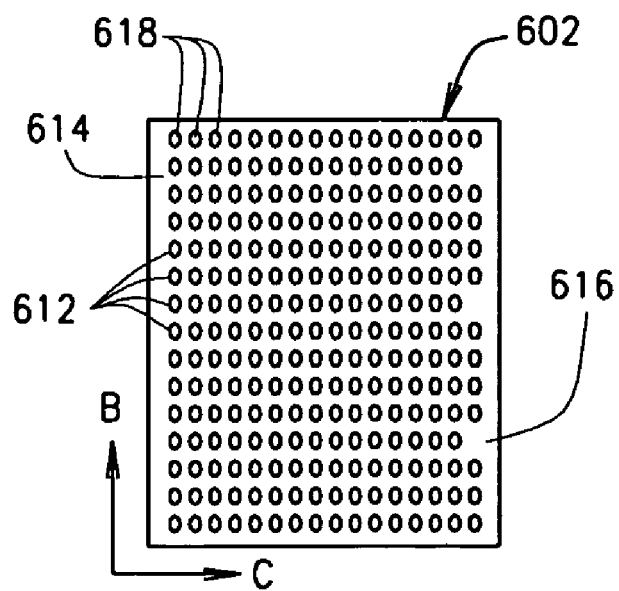
FIG. 18 is a plan view of a filled substrate portion of the circuit board shown in FIGS. 15-17.

The substrate layer 602 preferably includes a number of openings or holes 612 extending therethrough between a first major surface 614 (FIGS. 15 and 18) of the substrate layer and a second major surface 616 of the substrate layer opposing the first surface 614. The holes 612 may be arranged in an array in multiple columns and multiple rows as shown in FIGS. 16 and 18, although other arrangements of holes 614 may be utilized if desired. The finer the pattern of spaced holes 612 in the array, the higher the density of components that may be protected with the device 600. As one example, the holes may be generally circular in shape, and may be between 5 microns and 5 mils in diameter depending on the circuit density. Of course, the shape and size of the holes may be varied in other embodiments.

Each of the holes 612 defines a receptacle for a variable impedance material 618 that is received in each of the openings 612. The variable impedance material 618 may be the variable impedance material 70 described above or another known variable impedance material that exhibits a relatively high impedance when subjected to voltage and/or current up to a predetermined threshold value, and also exhibits a relatively low impedance when subjected to voltage and/or current that exceeds the predetermined threshold.

The variable impedance material 618 is situated in the plane of the substrate layer 602 and is arranged in a pattern or array corresponding to the arrangement of the holes 612 in the substrate layer 602. The edges of the holes 612 provides dielectric isolation between variable impedance material 618 in adjacent openings or holes 612 in the substrate layer 602. As such, each of holes 612, when filled with variable impedance material 618, provides a separate conductive path through the variable impedance material 618 in each hole 612 that may be independently operable from variable impedance material 618 in the remaining holes 612. That is, because of the spaced holes 612 and dielectric isolation therebetween provided by the substrate layer, some of the variable impedance material 618 in some of the holes 612 may switch to the low impedance state while other of the variable impedance material 618 in other holes 612 may remain in the high impedance state. Localized transient voltage protection is therefore possible wherein some but not all of the variable impedance material is exposed to currents and/or voltages causing the material to switch to the low impedance state while other variable impedance material in the substrate is not exposed to such currents and/or voltages.

The ground plane 604 may be a metallic layer of approximately the same size as the substrate layer 602 in the plane of the second major surface 616. The ground plane 604 may be attached to or otherwise formed on the lower major surface 618 of the dielectric substrate layer 602 using known techniques, and the ground plane 604 may be substantially coextensive with the lower major surface 616. That is, in one embodiment, the ground plane 604 continuously spans the entirety of the lower major surface 616 of the substrate layer 602, although it is contemplated that the ground plane may span less than an entirety of the lower major surface. The variable voltage material 618 in the holes 612 may directly contact the ground plane 604 without the presence of intervening materials or layers to maintain a low profile of the stacked layers in the board 600. The ground plane 604 may be formed of copper or copper alloy in one embodiment, although it is appreciated that other conductive metals, materials, and alloys may likewise be used to form the ground plane 604 in other embodiments.

The transmission layer 606 is situated on the first major surface 614 of the substrate layer 602 and directly contacts, without the presence of intervening layers or materials, the variable impedance material 618 in the holes 612 on a side of the substrate layer 602 opposite the ground plane 604 to maintain a low profile of the stacked layers in the board 600. In an exemplary embodiment, the transmission layer 606 is electrically conductive only in a direction, represented by arrow A in FIG. 15, that is substantially normal or perpendicular the major surfaces 614, 616 of the substrate layer 602. Further, the transmission layer 606 is electrically insulative in directions extending parallel to the plane of the major surfaces 614, 616 of the substrate layer 602, as represented by arrows B and C in FIGS. 16 and 18.

As best seen in FIG. 16, arrows A, B and C define a Cartesian coordinate system wherein arrows B and C represent a horizontal plane or an x, y plane relative to the plane of the substrate layer 602, while arrow A represents a vertical dimension or z axis extending normal to the plane. Electrically insulating properties of the transmission layer 606 in the horizontal plane, while being conductive in the vertical direction, establishes a vertical current path through the transmission layer 606 between the circuit layer 608 and the variable impedance material 608 in the holes 612 of substrate layer 602, while preventing shorting of the contact pads 610 of the circuit layer 608. Contact pads 610 and electrical traces in the circuit layer 608 may therefore be isolated from each other so as not to compromise the circuitry of the circuit layer 608. One such suitable material for use as the transmission layer is a conductive thermoset adhesive film having conductive particles dispersed in an adhesive allowing electrical interconnection of the particles through the thickness of the film (the z axis), but otherwise spaced far enough from one another in the plane of the film to be electrically insulating. Such z-axis adhesive films are commercially available, for example, from 3M of St. Paul, Minn.

The transmission layer 606 may encapsulate the first surface 614 of the substrate layer 602, and may extend continuously between the substrate layer 602 and the circuit layer 608 without openings formed therein. Encapsulation of the substrate layer 602 is especially advantageous when silicone polymers are present in the variable impedance material 618 to keep the silicone polymers from contaminating plating baths used to form the circuit layer 608.

The circuit layer 608 extends over the transmission layer 606, and as shown in the Figures, the circuit layer 608 is patterned into circuitry with lines, traces and conductive pads 610. Because of the density of the holes 612 in the substrate layer 602 that receives the variable impedance material 618, every trace, line, or contact pad 610 formed in the circuit layer 606 contacts, through the transmission layer 606, one or more of the holes 612 filled with the variable impedance material 618 in the substrate layer 602. As is also shown in the Figures, the traces, lines, or contact pads 610 formed in the circuit layer 608 are not located over and are not in contact with all of the openings 612 having variable impedance material 618 in the substrate 602. That is, some of the openings 612 and variable impedance material 618 therein of the substrate layer 602 are not utilized with specific circuitry in the circuit layer 608 and are not operable to provide transient voltage protection capability. The number and location of the holes 612 and variable impedance material 618 therein that are utilized or not utilized is dictated by the location and geometry of the lines, traces and pads in the circuit layer 608.

The variable impedance material 618 in the holes 612 of the substrate layer 602 likewise establish a direct current path to the ground plane 604. Thus, when voltage or current in the circuit layer 608 exceeds a predetermined threshold, depending on the characteristics of the variable impedance material 618, the variable impedance material switches to the low impedance state and creates a shunt current path from the affected portions of the circuit layer 608, through the transmission layer 606 and the variable impedance material 618 to the ground plane 604. Thus, the shunt current paths to ground when the variable impedance material switches to the low impedance state prevents high transient voltage events, including but not limited to electrostatic discharge events, from damaging components connected to the circuit layer 608. When transient high voltage events subside, the variable impedance material 618 switches back to the high impedance state for normal operation of the circuitry in the circuit layer 608 of the board 600.

Figure 19:
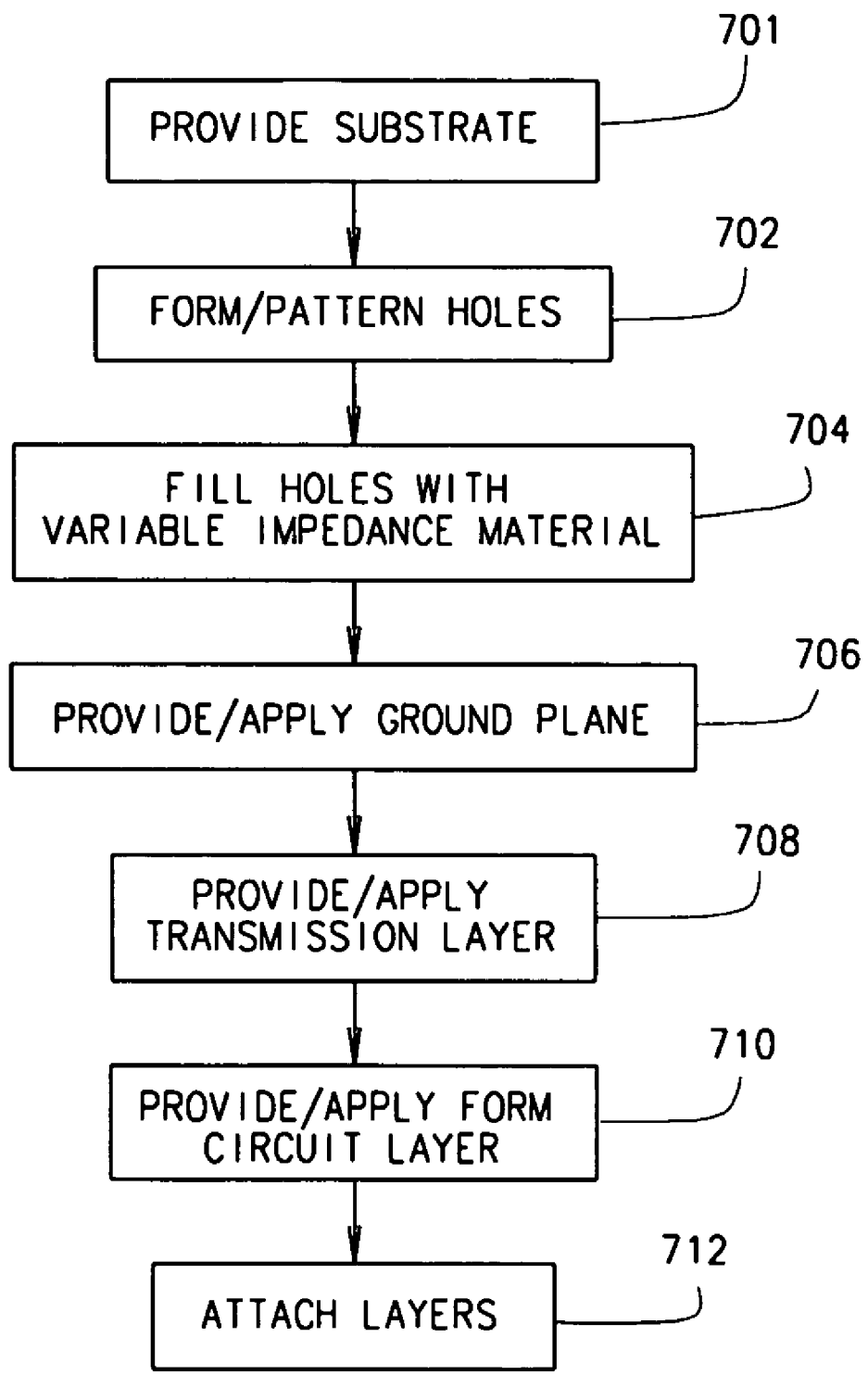
FIG. 19 is a process flow chart of a method of manufacturing the board shown in FIGS. 15-17.

The circuit board device 600 may be manufactured according to the method 700 illustrated in FIG. 19. A circuit board substrate, such as FR-4 board, or Flex circuit substrate, such as polyimide, liquid crystal polymer, or other polymer material, is provided 701 and patterned or formed 702 with a two dimensional array of holes through the substrate material. In various embodiments, the holes may formed 702 in the substrate mechanically with a drill, a punch or other tool. The holes may alternatively be formed 702 with a laser, such an excimer laser when a polyimide substrate is used, or the holes may be formed 702 via chemical or plasma etching techniques. The holes may be preformed in the substrate to provide quicker manufacturing of the device 600.

After the holes are formed 702, the holes in the substrate are subsequently filled 704 with the variable voltage material described above or another variable voltage material known in the art. The filled substrate with embedded impedance material 618, as depicted in FIG. 18, provides a universal platform for a variety of different circuits.

The ground plane may be applied or provided 706 to the filled substrate on the lower major surface, and the transmission layer may be applied or provided 708 to the filled substrate on the upper major surface opposite the lower major surface. In one embodiment, when so provided and/or attached, the ground plane is in direct contact with the variable voltage material on one side of the filled substrate, and the transmission layer is in direct contact with the variable voltage material on the other side of the filled substrate. In other embodiments, additional material layers, structures or intermediate connections may be established between the ground plane and the variable impedance material and/or the transmission layer and the variable impedance material.

In one embodiment, the substrate, such as a polyimide film, may be pre-laminated to a metal foil layer on one side prior to forming 702 the holes. For example, the substrate layer may be pre-attached to a copper film, and the pre-laminated polyimide substrate may be utilized and drilled or etched to form the hole pattern to be filled with variable voltage material. In another embodiment, the ground plane may be provided or attached after the holes are formed with a lamination process or other known metallization and formation process on the lower major surface 614 of the substrate 602.

The transmission layer, such as the z-axis conductive adhesive described above, may be provided and/or applied 708 to the substrate opposite the ground plane. The transmission layer may be supplied as a film and may be extended over the upper major surface 614 of the substrate. Alternatively, other techniques may be utilized to apply the transmission layer and interconnection to the variable impedance material in the substrate holes as described above.

Another metallic layer, such as another metal foil, may be applied and/or provided 710 over the transmission layer and attached 710 to the transmission layer over opposite the filled substrate to serve as the circuit layer. The circuit layer may be fabricated from a copper foil and may be patterned or formed 712 into a specific circuit including lines, traces and contact pads using known techniques. Patterning 712 of the circuit layer into a specific circuit formation having lines, traces and contact pads may occur before or after it is applied to the transmission layer using known techniques.

Once the layers are stacked as described, they may be attached 712 to one another in a known manner, including but not limited to lamination processes known in the art. The layers may be attached 712 in one or more steps in a series of lamination processes if desired. Of course, in embodiments wherein metallization techniques are used to form the layers, using known deposition, screen printing, photolithography and other techniques known in the art, each layer is attached to the next by virtue of the metallization, and a separate step of attaching the layers is not necessary.

The circuit board device 600 may be fabricated at relatively low cost and is readily adaptable to various configurations of circuits. All components connected to the board may be protected while preserving space on the board surface to mount components, and while mainlining a low profile of the board. Conductive paths for the harmful electrostatic discharge (EDS) pulses or other transient high voltages to electrical ground are provided to prevent damage to the circuit components and connected circuits, components or equipment associated with the board.

An embodiment of a transient voltage suppression device is disclosed herein. The device comprises a dielectric substrate layer defining a first major surface, a second major surface, and a plurality of holes extending therethrough. A variable impedance material substantially fills each of the plurality of holes in the substrate, and the variable impedance material exhibits a relatively high impedance when subjected to voltage and/or current up to a predetermined threshold value, and exhibits a relatively low impedance when subjected to voltage and/or current that exceeds the predetermined threshold. The variable impedance material defines a shunt current path through the holes when exhibiting the low impedance.

Optionally, the device comprises a transmission layer applied to the first major surface, with the transmission layer being electrically conductive in a direction normal to the first major surface and insulative in directions parallel to the plane of the first major surface. The transmission layer may comprise a z-axis conductive adhesive. A circuit layer may define a conductive path to the variable impedance material in the plurality of holes, with the circuit layer extending over the transmission layer and the circuit layer being patterned to define a circuit on the transmission layer. The circuit layer may be laminated to the substrate layer with the transmission layer therebetween, and the circuit layer may define at least one contact pad, the contact pad located over at least one of the holes to establish electrical connection with the variable impedance material in the at least one hole. A ground plane may be coupled to the substrate layer opposite the circuit layer, and may be laminated to the substrate layer. The substrate layer may be fabricated from a flexible material and may be selected from the group of a polyimide material, a liquid crystal polymer, or an equivalent material. Alternatively, the substrate layer may be fabricated from a rigid material and may be selected from the group of FR-4 board, phenolic, ceramic or equivalent material.

An embodiment of a transient voltage suppression circuit board is also provided. The circuit board comprises a dielectric substrate layer defining a first major surface, a second major surface, and a plurality of spaced holes arranged in an array, the holes extending between the first major surface and the second major surface. Each of the holes define a receptacle for a variable impedance material, and a ground plane in direct contact with the second major surface of the dielectric substrate layer. A variable impedance material substantially fills each of the plurality of holes in the substrate. The variable impedance material exhibits a relatively high impedance when subjected to voltage and/or current up to a predetermined threshold value, and exhibits a relatively low impedance when subjected to voltage and/or current that exceeds the predetermined threshold. The variable impedance material defines a shunt current path through the holes to the ground plane when exhibiting the low impedance.

Optionally, a transmission layer is applied to the first major surface, the transmission layer being electrically conductive in a direction normal to the first major surface, and insulative in the plane of the first major surface. A circuit layer may define a conductive path to the variable impedance material in the plurality of holes, the circuit layer extending over the transmission layer and the circuit layer being patterned to define a circuit on the transmission layer. The circuit layer may be laminated to the substrate layer with the transmission layer therebetween. The circuit layer may define at least one contact pad, and the contact pad may be located over at least one of the holes to establish electrical connection with the variable impedance material in the at least one hole. The substrate layer may be selected from the group of a polyimide material, a liquid crystal polymer, FR-4 board, phenolic, ceramic or equivalents thereof.

An embodiment of a circuit board having embedded transient voltage suppression is also disclosed, The circuit board comprises a dielectric substrate layer fabricated from a polyimide material, the substrate layer defining a first major surface, a second major surface, and a plurality of holes extending therethrough, each of the holes defining a receptacle for a variable impedance material. A variable impedance material substantially fills each of the plurality of holes in the substrate, wherein the variable impedance material exhibits a relatively high impedance when subjected to voltage and/or current up to a predetermined threshold value, and exhibits a relatively low impedance when subjected to voltage and/or current that exceeds the predetermined threshold. The variable impedance material defining a shunt current path through the holes to the ground plane when exhibiting the low impedance. A transmission layer extends over the first major surface and directly contacts the variable impedance material on the first major surface, with the transmission layer being electrically conductive in a direction normal to the first major surface, and insulative in the plane of the first major surface. A ground plane is laminated to the second major surface of the dielectric substrate layer and directly contacts the variable impedance material on the second major surface.

Optionally, a circuit layer may define a conductive path to the variable impedance material in the plurality of holes, with the circuit layer extending over the transmission layer and the circuit layer being patterned to define a circuit on the transmission layer. The circuit layer may be laminated to the substrate layer with the transmission layer therebetween. The circuit layer may define at least one contact pad, the contact pad located over at least one of the holes to establish electrical connection with the variable impedance material in the at least one hole.

A method of fabricating a circuit board is also disclosed, the method comprising: providing a dielectric substrate layer having an array of holes formed therethrough; filling the holes with a variable impedance material; forming a circuit pattern; and connecting the circuit pattern to the variable impedance material in selected ones of the holes, thereby forming a shunt current path between the circuit pattern and the dielectric substrate via the selected ones of the holes.

The method may also comprise providing a ground plane on one side of the dielectric substrate layer, wherein providing the ground plane comprises laminating the ground plane to the dielectric substrate layer after the array of holes is formed. Alternatively, providing the ground plane may comprise laminating the ground plane to the dielectric substrate before the array of holes is formed. Still further, providing a dielectric substrate layer may comprise providing a polyimide substrate pre-laminated to a metal foil. Providing a dielectric substrate layer may comprise providing a rigid substrate material, or may comprise providing a flexible substrate material. Connecting the circuit pattern may comprise attaching a transmission layer to the substrate layer, the transmission layer extending between the substrate layer and the circuit pattern, the transmission layer being electrically conductive in a direction normal to the substrate layer and insulative in a plane parallel to the substrate layer. Connecting the circuit pattern may comprise applying a z-axis conductive adhesive to the substrate layer.

An embodiment of a circuit board is disclosed comprising a dielectric substrate; means for connecting to electrical ground, the means for connecting coupled to the substrate; means for defining a circuit pattern on the substrate, the means for defining the circuit pattern coupled to the substrate opposite the means for connecting to electrical ground; and variable impedance means, situated in the dielectric substrate, for establishing a plurality of shunt currents paths between the means for defining the circuit pattern and the means for connecting to electrical ground in response transient high voltage events.

Optionally, the circuit board may comprise transmission means for conducting shunt current from the circuit pattern to the means for transient voltage suppression, without shorting of adjacent shunt current paths. The transmission means may be conductive in a first direction and insulative in a plane extending perpendicular to the first direction. The substrate may be selected from the group of a polyimide material, a liquid crystal polymer, FR-4 board, phenolic, ceramic or equivalents thereof. The dielectric substrate may be planar, and the circuit board may further comprise means for receiving the means for transient voltage suppression in the plane of the dielectric substrate.

While the invention has been described in terms of various specific embodiments, those skilled in the art will recognize that the invention can be practiced with modification within the spirit and scope of the claims.

What is claimed is:

1. A transient voltage suppression device comprising:
 a circuit board having embedded transient voltage protection capability for a plurality of electronic components attached thereto, the circuit board comprising:
  a dielectric substrate layer defining a first major surface, a second major surface, and an array of holes extending therethrough;
  the array of holes being substantially filled with a variable impedance material, wherein the variable impedance material exhibits a relatively high impedance when subjected to voltage and/or current up to a predetermined threshold value, and exhibits a relatively low impedance when subjected to voltage and/or current that exceeds the predetermined threshold, the variable impedance material defining a shunt current path through each of the filled holes when exhibiting the low impedance;
  an electrically conductive transmission layer extending on the first major surface of dielectric substrate layer and establishing a conductive path with the filled holes; and
  a circuit layer formed directly on and defining a circuit pattern on the transmission layer and establishing a conductive path to the transmission layer opposite the filled holes, the circuit layer including a plurality of contact pads each providing for connection to a respective one of the electronic components, and the transmission layer electrically isolating the contact pads from one another.

2. The device of claim 1, wherein the transmission layer is electrically conductive in a direction normal to the first major surface, and insulative in directions parallel to the plane of the first major surface.

3. The device of claim 1, wherein the transmission layer comprises a z-axis conductive adhesive.

4. The device of claim 1, wherein the variable impedance materials in the each of the filled holes is independently operable.

5. The device of claim 1, wherein the circuit layer is laminated to the substrate layer with the transmission layer therebetween.

6. The device of claim 1, further comprising a ground plane extending on the second major surface of the dielectric substrate layer.

7. The device of claim 6, wherein the ground plane is laminated to the substrate layer.

8. The device of claim 1, wherein the dielectric substrate layer is fabricated from a flexible material.

9. The device of claim 8, wherein the flexible material is selected from the group of a polyimide material, a liquid crystal polymer, or an equivalent material.

10. The device of claim 1, wherein the dielectric substrate layer is fabricated from a rigid material.

11. The device of claim 10, wherein the substrate is selected from the group of FR-4 board, phenolic, ceramic or equivalent material.

12. The device of claim 1, wherein the transmission layer encapsulates the first major surface of the dielectric substrate layer.

13. A transient voltage suppression circuit board, comprising:
   a laminated circuit board structure for mounting of a plurality of electronic components, the laminated structure comprising:
      a dielectric substrate layer defining a first major surface, a second major surface, and a plurality of spaced holes arranged in an array, the holes extending between the first major surface and the second major surface, each of the holes defining a receptacle for a variable impedance material;
      a ground plane in direct contact with the second major surface of the dielectric substrate layer;
      a variable impedance material substantially filling each of the plurality of holes in the substrate, wherein the variable impedance material exhibits a relatively high impedance when subjected to voltage and/or current up to a predetermined threshold value, and exhibits a relatively low impedance when subjected to voltage and/or current that exceeds the predetermined threshold, the variable impedance material defining a shunt current path through the holes to the ground plane when exhibiting the low impedance;
      a transmission layer applied to the first major surface, the transmission layer being electrically conductive in a direction normal to the first major surface, and insulative in the plane of the first major surface; and a circuit layer formed directly on the transmission layer.

14. The circuit board of claim 13, wherein the transmission layer comprises a z-axis conductive adhesive.

15. The circuit board of claim 13, wherein the circuit layer defines a conductive path to the variable impedance material in the plurality of holes, the circuit layer extending over the transmission layer and the circuit layer being patterned to define a circuit on the transmission layer.

16. The circuit board of claim 13, wherein the circuit layer defines at least one contact pad, the contact pad located over at least one of the holes to establish electrical connection with the variable impedance material in the at least one hole.

17. The circuit board of claim 13, wherein the substrate layer is selected from the group of a polyimide material, a liquid crystal polymer, FR-4 board, phenolic, ceramic or equivalents thereof.

18. A circuit board having embedded transient voltage suppression, the circuit board comprising:
   a circuit board structure for electrically connecting a plurality of electrical components, the structure comprising:
      a dielectric substrate layer fabricated from a polyimide material, the substrate layer defining a first major surface, a second major surface, and a plurality of holes extending therethrough, each of the holes defining a receptacle for a variable impedance material;
      a variable impedance material substantially filling each of the plurality of holes in the substrate, wherein the variable impedance material exhibits a relatively high impedance when subjected to voltage and/or current up to a predetermined threshold value, and exhibits a relatively low impedance when subjected to voltage and/or current that exceeds the predetermined threshold, the variable impedance material defining a shunt current path through the holes to the ground plane when exhibiting the low impedance;
      a transmission layer extending over the first major surface and directly contacting the variable impedance material on the first major surface, the transmission layer being electrically conductive in a direction normal to the first major surface, and insulative in the plane of the first major surface; a circuit layer formed on the transmission layer and
      a ground plane laminated to the second major surface of the dielectric substrate layer and directly contacting the variable impedance material on the second major surface.

19. The circuit board of claim 18, wherein the transmission layer comprises a z-axis conductive adhesive.

20. The circuit board of claim 18, wherein the circuit layer defines a conductive path to the variable impedance material in the plurality of holes, the circuit layer extending over the transmission layer and the circuit layer being patterned to define a circuit on the transmission layer.

21. The circuit board of claim 18, wherein the circuit layer is laminated to the substrate layer with the transmission layer therebetween.

22. The circuit board of claim 18, wherein the circuit layer defines at least one contact pad, the contact pad located over at least one of the holes to establish electrical connection with the variable impedance material in the at least one hole.

23. A method of fabricating a circuit board, the method comprising:
   providing a dielectric substrate layer having an array of holes formed therethrough;
   filling the holes with a variable impedance material;
   attaching a transmission layer to the substrate layer, the transmission layer being electrically conductive in a direction normal to the substrate layer and insulative in a plane parallel to the substrate layer;
   forming a circuit pattern directly on the transmission layer, the circuit pattern being configured to mount and electrically connect a plurality of electrical components,
   thereby establishing a shunt current path between the circuit pattern and the variable impedance material via the transmission layer.

24. The method of claim 23, further comprising attaching a ground plane to the transmission layer.

25. The method of claim 24, wherein attaching the ground plane comprises laminating the ground plane to the dielectric substrate layer after the array of holes is formed.

26. The method of claim 25, wherein attaching the ground plane comprises laminating the ground plane to the dielectric substrate before the array of holes is formed.

27. The method of claim 23, wherein attaching a dielectric substrate layer comprises attaching a polyimide substrate pre-laminated to a metal foil.

28. The method of claim 23, wherein attaching a dielectric substrate layer comprises providing a rigid substrate material.

29. The method of claim 23, wherein attaching a dielectric substrate layer comprises providing a flexible substrate material.

30. A circuit board comprising:
a dielectric substrate;
means for connecting to electrical ground, the means for connecting coupled to the substrate;
means for defining a circuit pattern coupled to the substrate for connection of a plurality of electrical components, the means for defining the circuit pattern coupled to the substrate opposite the means for connecting to electrical ground;
variable impedance means, situated in the dielectric substrate, for establishing a plurality of shunt currents paths between the means for defining the circuit pattern and the means for connecting to electrical ground in response transient high voltage events; and
transmission means for conducting shunt current from the circuit pattern to the variable impedance means, without shorting of adjacent shunt current paths; wherein the means for defining a circuit pattern are formed on the transmission means.

31. The circuit board of claim 30, wherein the transmission means is conductive in a first direction and insulative in a plane extending perpendicular to the first direction.

32. The circuit board of claim 30 wherein the substrate is selected from the group of a polyimide material, a liquid crystal polymer, FR-4 board, phenolic, ceramic or equivalents thereof.

33. The circuit board of claim 30, wherein the dielectric substrate is planar, the circuit board further comprising means for receiving the means for transient voltage suppression in the plane of the dielectric substrate.

* * * * *